(12) United States Patent
Engelhardt et al.

(10) Patent No.: US 9,406,564 B2
(45) Date of Patent: Aug. 2, 2016

(54) SINGULATION THROUGH A MASKING STRUCTURE SURROUNDING EXPITAXIAL REGIONS

(71) Applicant: Infineon Technologies AG, Neubiberg (DE)

(72) Inventors: Manfred Engelhardt, Villach-Landskron (AT); Johannes Baumgartl, Riegersdorf (AT); Manfred Kotek, Villach (AT); Hans-Joachim Schulze, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/086,886

(22) Filed: Nov. 21, 2013

(65) Prior Publication Data
US 2015/0137144 A1    May 21, 2015

(51) Int. Cl.
| | |
|---|---|
| *H01L 29/66* | (2006.01) |
| *H01L 29/20* | (2006.01) |
| *H01L 21/8234* | (2006.01) |
| *H01L 21/306* | (2006.01) |
| *H01L 21/78* | (2006.01) |
| *H01L 21/683* | (2006.01) |
| *H01L 21/265* | (2006.01) |

(52) U.S. Cl.
CPC ...... *H01L 21/8234* (2013.01); *H01L 21/30604* (2013.01); *H01L 21/30612* (2013.01); *H01L 21/6835* (2013.01); *H01L 21/78* (2013.01); *H01L 21/26506* (2013.01); *H01L 29/6659* (2013.01); *H01L 2221/6834* (2013.01); *H01L 2221/68327* (2013.01); *H01L 2221/68368* (2013.01)

(58) Field of Classification Search
CPC .......................... H01L 21/7602; C30B 29/406
USPC .................... 438/424; 257/506, 622
See application file for complete search history.

(56) References Cited

U.S. PATENT DOCUMENTS

| | | | |
|---|---|---|---|
| 4,064,620 | A | 12/1977 | Lee et al. |
| 5,674,355 | A | 10/1997 | Cohen et al. |
| 5,801,082 | A | 9/1998 | Tseng |
| 6,153,010 | A * | 11/2000 | Kiyoku et al. ............... 117/95 |
| 6,255,198 | B1 * | 7/2001 | Linthicum et al. ......... 438/481 |
| 6,255,712 | B1 | 7/2001 | Clevenger et al. |

(Continued)

FOREIGN PATENT DOCUMENTS

| | | |
|---|---|---|
| EP | 0884767 A3 | 1/2000 |
| EP | 1758171 A1 | 2/2007 |

(Continued)

OTHER PUBLICATIONS

Jia, S., et al., "AlGaN—GaN HEMTs on Patterned Silicon (111) Substrate," IEEE Electron Device Letter, vol. 26, No. 3, Mar. 2005, pp. 130-132.

(Continued)

*Primary Examiner* — Evan Pert
*Assistant Examiner* — Changhyun Yi
(74) *Attorney, Agent, or Firm* — Slater Matsil, LLP

(57) ABSTRACT

In one embodiment, the semiconductor die includes a selective epitaxial layer including device regions, and a masking structure disposed around sidewalls of the epitaxial layer. The masking structure is part of an exposed surface of the semiconductor die.

41 Claims, 22 Drawing Sheets

(56) References Cited

U.S. PATENT DOCUMENTS

| | | | |
|---|---|---|---|
| 6,294,803 | B1 | 9/2001 | Gil |
| 6,528,732 | B1 | 3/2003 | Okubora et al. |
| 6,541,352 | B2 | 4/2003 | Wachtler |
| 6,967,132 | B2 | 11/2005 | Gonzalez et al. |
| 7,399,712 | B1 | 7/2008 | Graff |
| 7,629,228 | B2 | 12/2009 | Haji et al. |
| 7,767,551 | B2 | 8/2010 | Arita et al. |
| 7,803,717 | B2 | 9/2010 | Rawdanowicz et al. |
| 7,994,026 | B2 | 8/2011 | Harikai et al. |
| 8,026,181 | B2 | 9/2011 | Arita et al. |
| 8,748,297 | B2 | 6/2014 | Stranzl et al. |
| 2002/0011612 | A1 | 1/2002 | Hieda |
| 2003/0013233 | A1 | 1/2003 | Shibata |
| 2004/0102025 | A1 | 5/2004 | Arita |
| 2005/0012111 | A1 | 1/2005 | Howard et al. |
| 2008/0054301 | A1 | 3/2008 | Wang et al. |
| 2008/0064215 | A1 | 3/2008 | Na et al. |
| 2008/0230911 | A1 | 9/2008 | Li |
| 2008/0254639 | A1 | 10/2008 | Graff |
| 2009/0209087 | A1 | 8/2009 | Arita |
| 2010/0009518 | A1 | 1/2010 | Wu et al. |
| 2010/0019279 | A1* | 1/2010 | Chen et al. .......... 257/194 |
| 2010/0022071 | A1 | 1/2010 | Arita et al. |
| 2010/0048001 | A1 | 2/2010 | Harikai et al. |
| 2010/0072579 | A1 | 3/2010 | Thies et al. |
| 2010/0078771 | A1 | 4/2010 | Barth et al. |
| 2010/0136784 | A1 | 6/2010 | Mebarki et al. |
| 2010/0173474 | A1 | 7/2010 | Arita et al. |
| 2011/0309479 | A1 | 12/2011 | Engelhardt |
| 2012/0015522 | A1 | 1/2012 | Arita et al. |
| 2012/0021608 | A1* | 1/2012 | Arita et al. .......... 438/703 |
| 2012/0038034 | A1 | 2/2012 | Shin et al. |
| 2013/0026489 | A1* | 1/2013 | Gambin et al. ......... 257/77 |
| 2013/0175614 | A1* | 7/2013 | Na .................... 257/338 |
| 2014/0235035 | A1 | 8/2014 | Stranzl et al. |

FOREIGN PATENT DOCUMENTS

| | | |
|---|---|---|
| WO | 0031783 | 6/2000 |
| WO | 2004042783 A2 | 5/2004 |
| WO | 2013001014 A1 | 1/2013 |
| WO | 2013036376 A2 | 3/2013 |

OTHER PUBLICATIONS

Brown, J.D., et al., "AlGaN/GaN HFETs fabricated on 100-mm GaN on silicon (111) substrates," Solid-State Electronics 46, Pergamon, Feb. 19, 2002, pp. 1535-1539.

Chumbes, E. M., et al., "AlGaN/GaN High Electron Mobility Transistors on Si(111) Substrates," IEEE Transactions on Electron Devices, vol. 48, No. 3, Mar. 2001, pp. 420-426.

Jamil, M., et al., "Development of strain reduced GaN on Si (111) by substrate engineering," Applied Physics Letter 87, Aug. 17, 2005, 3 pages.

Paisley, M.J., et al., "Growth of cubic phase gallium nitride by modified molecular-beam epitaxy," Department of Materials Science and Engineering, North Carolina State University, Nov. 14, 1988, pp. 701-705.

Honda, Y., et al., "Growth of GaN free from cracks on a (111) Si substrate by selective metalorganic vapor-phase epitaxy," Applied Physics Letters, vol. 80, No. 2, Jan. 14, 2002, pp. 222-224.

Powell, J. A., et al., "Growth of step-free surfaces on device-size (0001)SiC mesas," Applied Physics Letters, vol. 77, No. 10, Sep. 4, 2000, pp. 1449-1451.

Wu, C., et al., "Heteroepitaxy of GaN on Si(111) realized with coincident-interface AlN/B—$Si_3N_4$(0001) double-buffer structure," Applied Physics Letters, vol. 83, No. 22, Dec. 1, 2003, pp. 4530-4532.

Chowdhury, I., et al., "High growth rate 4H—SiC epitaxial growth using dichlorosilane in a hot-wall CVD reactor," Materials Science, Nov. 4, 2010, 30 pages.

Liu, W., et al., "Influence of the AlN interlayer crystal quality on the strain evolution of GaN layer grown o Si (111)," Applied Physics Letters 90, Jan. 5, 2007, 3 pages.

Rajagopal, P., et al., "Large-Area, Device Quality GaN on Si Using a Novel Transition Layer Scheme," Materials Research Society, 2002 MRS Fall Meeting, vol. 743, 6 pages.

Armitage, R., et al., "Lattice-matched HfN buffer layers for epitaxy of GaN on Si," Applied Physics Letters, vol. 81, No. 8, Aug. 19, 2002, pp. 1450-1452.

Chyurlia, P. N., et al., "Monolithic integration of AlGaN/GaN HFET with MOS on silicon <111substrates," Electronics Letters, 46, 3, NRC Publications Archive, Feb. 4, 2010, 3 pages.

La Via, F., "Silicon Carbide Epitaxy," Research Signpost, 2012, 262 pages.

Kawana, D., et al., "Bilayer Resist for Sub-65 nm Lithography," Semiconductor International, www.semiconductor.net, Feb. 2006, 4 pages.

Oh, K. S., et al., "Formation and Characteristics of Fluorinated Amorphous Carbon Films Deposited by CF4/CH4 ICPCVD," Journal of Korean Physical Society, vol. 39, No. 2, Aug. 2001, pp. 291-295.

Robertson, J., Materials Science and Engineering R 37, 2002, 1 page.

Roy, M. R., "Surface Properties of Hard Fluorinated Amorphous Carbon Films Deposited by Pulsed-DC Discharges," University of Barcelona, Doctoral Thesis, Jan. 18, 2010, 185 pages.

\* cited by examiner

SINGULATION THROUGH A MASKING STRUCTURE SURROUNDING EXPITAXIAL REGIONS

TECHNICAL FIELD

The present invention relates generally to semiconductor devices, and more particularly to predetermined kerf regions and methods of fabrication thereof.

BACKGROUND

Semiconductor devices are used in many electronic and other applications. Semiconductor devices may comprise integrated circuits that are formed on semiconductor wafers. Alternatively, semiconductor devices may be formed as monolithic devices, e.g., discrete devices. Semiconductor devices are formed on semiconductor wafers by depositing many types of thin films of material over the semiconductor wafers, patterning the thin films of material, doping selective regions of the semiconductor wafers, etc.

In a conventional semiconductor fabrication process, a large number of semiconductor devices are fabricated in a single wafer. After completion of device level and interconnect level fabrication processes, the semiconductor devices on the wafer are separated. For example, the wafer may undergo singulation. During singulation, the wafer is mechanically treated and the semiconductor devices are physically separated to form individual dies. However, separation processes are expensive and can result in formation of cracks and defects that can grow larger and result in yield loss.

SUMMARY OF THE INVENTION

In accordance with an embodiment of the present invention, a semiconductor die comprises a selective epitaxial layer comprising device regions, and a masking structure disposed around sidewalls of the epitaxial layer. The masking structure is part of an exposed surface of the semiconductor die.

In accordance with an embodiment of the present invention, a semiconductor die comprises a selective epitaxial layer comprising device regions disposed over a substrate, a masking structure disposed in the substrate, and a fill material disposed over the masking structure. The fill material is disposed around sidewalls of the selective epitaxial layer and is part of an exposed surface of the semiconductor die.

In accordance with an embodiment of the present invention, a method of forming a semiconductor chip comprises providing a substrate comprising a first region, a second region, and a third region. The first region is disposed between the second region and the third region. The masking structure covers the first region of the substrate. An epitaxial layer is grown from a first major surface of the substrate. The epitaxial layer comprises a first layer disposed over the second region and a second layer disposed over the third region. The masking structure prevents the epitaxial layer from growing at the first region. Using a singulation process, forming a first semiconductor chip comprising the first layer and a second semiconductor chip comprising the second layer without dicing through the epitaxial layer.

The foregoing has outlined rather broadly the features of an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which:

FIG. 1, which includes FIGS. 1A-1C, illustrates a semiconductor die in accordance with embodiments of the present invention, wherein FIG. 1A illustrates a cross-sectional view, FIG. 1B is a top view of the semiconductor die, FIG. 1C illustrates a magnified view illustrating a plurality of transistors formed within the epitaxial layer;

FIG. 2, which includes

FIG. 3, which includes

FIG. 4, which includes

FIG. 5, which includes

FIG. 6, which includes

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Epitaxial processes are increasingly being used to form active regions of the semiconductor devices. Additionally, epitaxial process may be used to form hetero-epitaxial layers. For example, Si, SiC or GaN technologies may use epitaxial silicon, silicon carbide (SiC), gallium nitride (GaN) over a silicon or silicon carbide substrate. However, such hetero-epitaxial layers are susceptible to cracking and/or chipping during subsequent chip singulation processes. In particular, singulation by mechanical methods (sawing, stealth dicing etc.) right through the hetero-epitaxial layer can damage the epitaxial layer. Such chipping, crack formation, and other damage may impair electrical performance or even destroy the functionality of the chip and thus impact product yield. Embodiments of the present invention overcome these and other deficiencies by the use of predetermined kerf regions over which the epitaxial layer is not grown.

A structural embodiment of the device will be described using FIG. 1. Additional structural embodiments will be described using FIGS. 3C, 3D, 4C, 5E, and 6M. An embodiment of fabricating the device will be described using FIG. 2. Alternative embodiments of fabricating the device will be described using FIGS. 3-6.

Figure 1A:
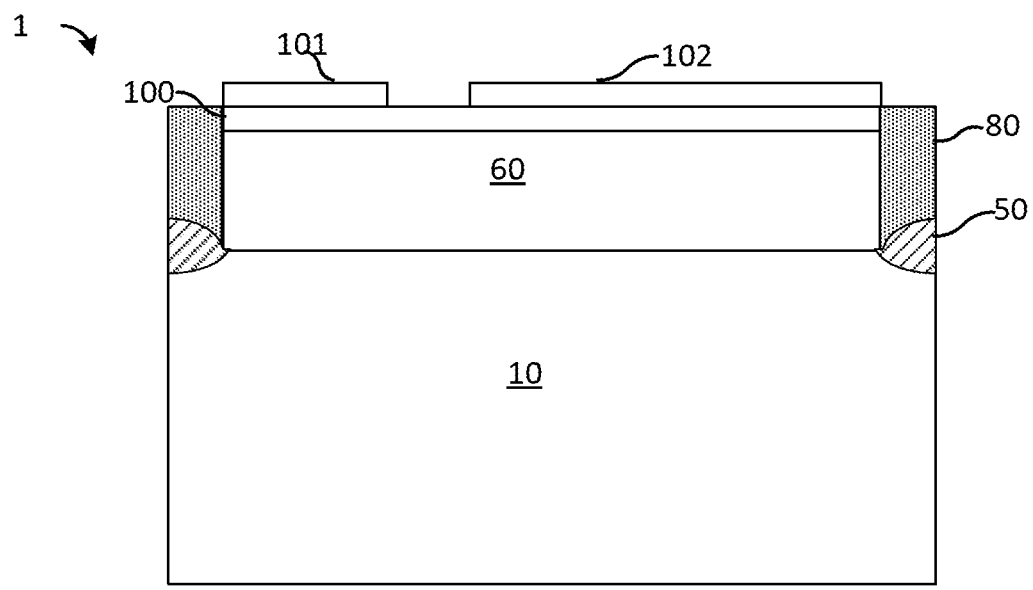
Figure 1B:
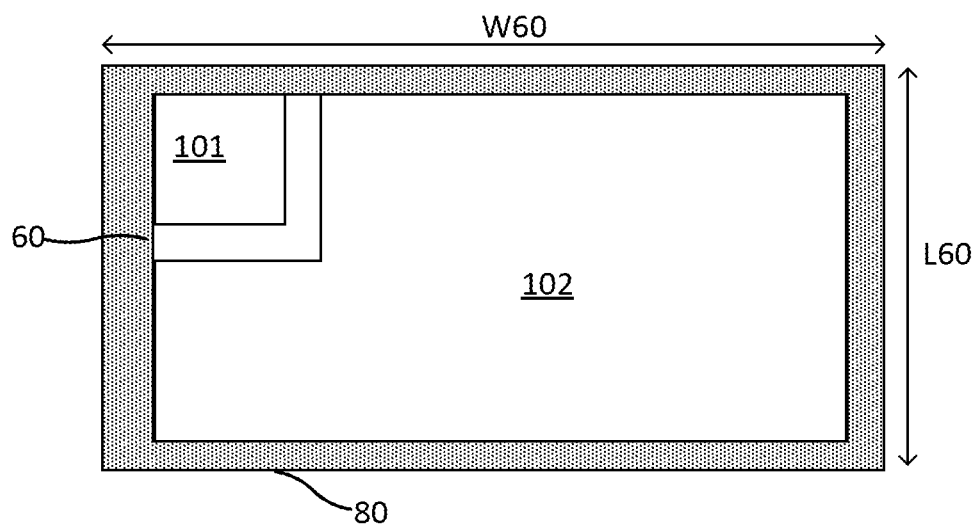
Figure 1C:
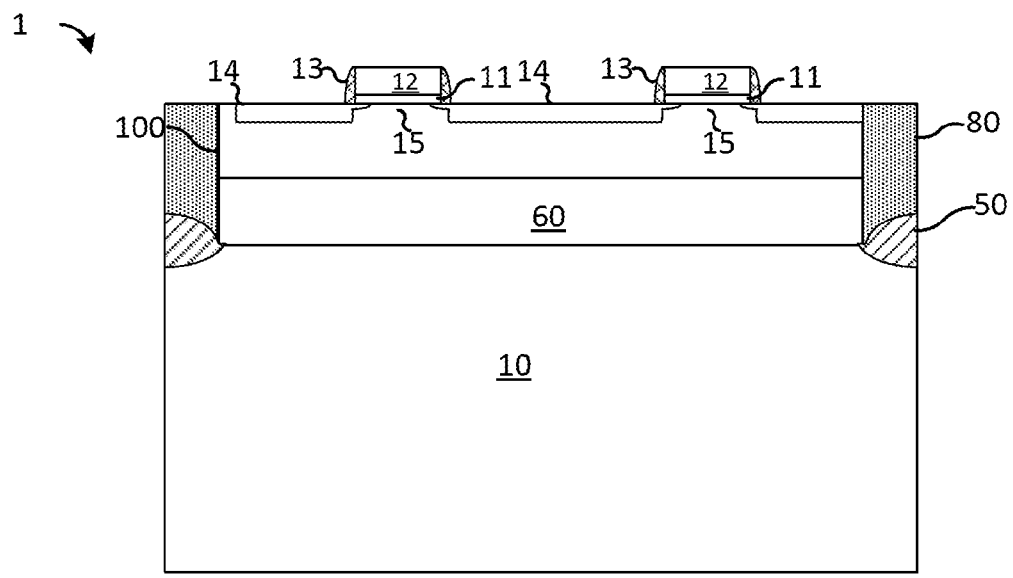

FIG. 1, which includes FIGS. 1A-1C, illustrates a semiconductor die in accordance with embodiments of the present invention. FIG. 1A illustrates a cross-sectional view, FIG. 1B is a top view of the semiconductor die, FIG. 1C illustrates a magnified view illustrating a plurality of transistors formed within the epitaxial layer.

Referring to FIG. 1A, a semiconductor substrate 10 after the completion of front end of line processing and back end of line processing is illustrated. The semiconductor substrate 10 has a semiconductor chip 1 formed within. The chip 1 may be any type of chip. For example, the chip 1 may be a power device, a logic chip, a memory chip, an analog chip, and other types of chips. The chip 1 may comprise a plurality of devices such as transistors, insulator gate bipolar transistors, power MOSFETs, power MOSFETs with compensation structures in the drift zone, or diodes forming an integrated circuit or may be a discrete device such as a single transistor, insulator gate bipolar transistor, a power MOSFET, a power MOSFET with compensation structures in the drift zone, or a single diode. The chip 1 may comprise various types of active and passive devices such as diodes, transistors, insulator gate bipolar transistors, power MOSFETs, power MOSFETs with compensation structures in the drift zone, thyristors, capacitors, inductors, resistors, optoelectronic devices, sensors, microelectromechanical systems, and others. In an alternative embodiment, the chip 1 is a discrete semiconductor device, for example, a discrete power transistor, discrete insulator gate bipolar transistor, a discrete power MOSFET, a discrete power MOSFET with compensation structures in the drift zone. Alternatively, the active devices may comprise diodes including light emitting diodes, laser diodes, and others.

Unlike conventional semiconductor dies, the chip 1 comprises a selective epitaxial layer 60 disposed over the substrate 10. The selective epitaxial layer 60, however, does not cover all of the substrate 10. Rather, the selective epitaxial layer 60 is formed only in the central portion of the chip 1 but not in an edge or peripheral portion of the chip 1, where the singulation is foreseen. The length L60 and the width W60 of the selective epitaxial layer 60 are illustrated better in FIG. 1B, which is the top view.

Referring to FIG. 1A, device regions 100 are disposed within the substrate 10. The device regions 100 may include doped regions in various embodiments. Further, some portion of the device regions 100 may be formed over the substrate 10. The device regions 100 may include active regions such as channel regions of transistors. The selective epitaxial layer 60 comprises a top surface and an opposite bottom surface. In various embodiments, the active devices are formed closer to the top surface of the selective epitaxial layer 60 than the bottom surface. The active devices are formed in device regions 100 of the selective epitaxial layer 60. Alternatively, the active devices may be formed within substantially the entire thickness of the selective epitaxial layer 60, for example, a vertical transistor, a insulator gate with compensation structures in the drift zone, or a vertical diode. The epitaxial layer 60 may contain the drift zone above the bottom surface of the selective epitaxial layer 60. For example, a vertical n-channel field effect transistor may include an n-doped field stop zone or an n-doped buffer layer above a n-doped drain. The n-doped field stop zone or an n-doped buffer layer may be used to stop the extension of the space charge layer, or improve avalanche capability, or improve the cosmic radiation hardness of the devices by an at least partial compensation of electron currents. In various embodiments, the epitaxial layer 60 may include drain, drift, channel, and source regions, which may be formed using the same semiconductor material (homo-epitaxy) or different semiconductor material (hetero-epitaxy).

Examples of heteroepitaxial processes include gallium nitride on silicon, gallium nitride on silicon carbide, gallium nitride on silicon carbide, silicon carbide on silicon followed by gallium nitride on the silicon carbide, gallium nitride on silicon followed by aluminum gallium nitride on the gallium nitride.

The chip 1 may include all necessary interconnects, connections, pads etc. for coupling between devices and/or with external circuitry. These connections may be formed in or over the selective epitaxial layer 60. As an example, FIG. 1A illustrates a first contact pad 101 and a second contact pad 102 formed over the top surface of the device regions 100. The first contact pad 101 may be, for example, a gate pad and the second contact pad 102 can be a contact to the source and body zones of the devices.

The sidewalls of the selective epitaxial layer 60 are surrounded by a fill material 80. The fill material 80 may be a glass, silicon dioxide, silicon nitride, resins, low-k dielectric materials, and other dielectric materials in various embodiments.

The fill material 80 is disposed over a masking structure 50. In one embodiment, the masking structure 50 comprises silicon dioxide and comprises a shape of a bird's beak. For example, in FIG. 1A, the bird's beak on the left side of the page is facing towards the central portion of the chip 1 while the other sidewall of the masking structure 50 is part of the exposed surface of the semiconductor die.

As illustrated in FIG. 1A, the masking structure 50 has a bottom surface that is lower than the major top surface of the substrate 10 indicating that the formation of the masking structure 50 consumed a portion of the substrate 10. Additionally, the selective epitaxial layer 60 is not formed epitaxially over the masking structure 50.

As an illustration FIG. 1C shows a plurality of transistors formed in the selective epitaxial layer 60. Gate lines 12 are formed over channel regions 15. The gate lines 12 are separated from the channel regions 15 by the gate dielectric layers 11. Source/drain regions 14 are formed in the selective epitaxial layer 60. The transistors may include other structures such as spacers 13, contact plugs etc., which are not shown. Additional well regions may be formed in the selective epitaxial layer 60 if necessary. The above is just one example. In various embodiments, other types of devices, which are partially listed above, may be involved in this method.

FIG. 2, which includes FIGS. 2A-2K, illustrates a semiconductor device during various stages of fabrication in accordance with embodiments of the present invention.

Figure 2A:
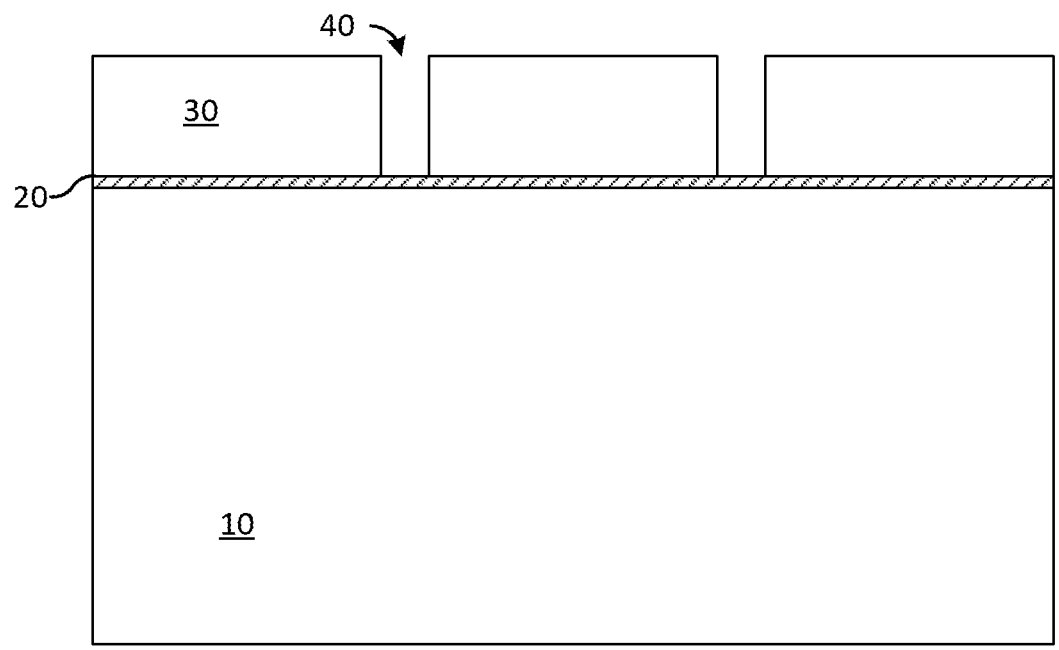
FIGS. 2A-2K, illustrates a semiconductor device during various stages of fabrication in accordance with embodiments of the present invention.

Referring to FIG. 2A, a pad oxide 20 and a patterned hard mask layer 30 are formed over a substrate 10. In various embodiments, the substrate 10 may comprise silicon or silicon carbide. The substrate 10 may be a wafer in various embodiments. The substrate 10 may include one or more epitaxial layers. In one or more embodiments, the substrate 10 may be a bulk silicon wafer or a silicon-on-insulator wafer. In some embodiments, the substrate 10 may be an III-V substrate with elements from Group III and Group V, or the substrate 10 may be an II-VI substrate with elements from Group II and Group VI. In one or more embodiments, the substrate 10 may be a silicon-on-sapphire (SOS) substrate. In one or more embodiments, the substrate 10 may be a germanium-on-insulator (GeOI) substrate. In one or more embodiments, the substrate 10 may include one or more semiconductor materials such as silicon, silicon germanium, silicon carbide, germanium, gallium arsenide, indium arsenide, gallium nitride, indium gallium arsenide, or indium antimonide.

A pad oxide 20 is formed over the substrate 10. The pad oxide 20 may comprise about 50 nm of silicon dioxide in one embodiment. In various embodiments, the pad oxide 20 may comprise a thickness of about 20 nm to about 100 nm. The pad oxide 20 may be formed by thermal oxidation in various embodiments. In alternative embodiments, the pad oxide 20 may be formed using a deposition process such as a chemical vapor deposition process. For example, the pad oxide 20 may be grown by exposing the surface of the substrate 10 to a temperature of about 800° C. to about 950° C., and, for example, about 15 min/900° C. in one case.

A hard mask layer 30 is formed over the pad oxide 20. The hard mask layer 30 may be deposited over the pad oxide 20 in one or more embodiments. The hard mask layer 30 may comprise a nitride layer in one or more embodiments. In one or more embodiments, the hard mask layer 30 may be deposited using a chemical vapor deposition process at temperature of about 550° C. to about 800° C.

In various embodiments, the hard mask layer 30 may comprise about 60 nm to about 300 nm in thickness. For example, the hard mask layer 30 may comprise 200 nm of silicon nitride in one embodiment. Alternatively, the pad oxide 20 and the hard mask layer 30 may comprise other materials and dimensions.

A plurality of trenches 40 are formed or patterned in the hard mask layer 30 using a lithography process, as shown in FIG. 2A. For example, a layer of photosensitive material such as a photoresist (not shown) may be deposited over the hard mask layer 30, and the layer of photoresist may be patterned with a desired pattern for the trenches 40. The layer of photoresist may be patterned by exposure to energy through a lithography mask, for example, also not shown. Alternatively, a reflective lithography mask or direct patterning may also be used to pattern the layer of photoresist. The layer of photoresist may then be used as an etch mask while portions of the hard mask layer 30 are etched away or removed to form the trenches 40 using an etch process such as a reactive ion etch (RIE) process. After patterning the photo resist layer, the hard mask layer 30 is etched to form the structure shown in FIG. 2A, for example using a dry etching process. The dry etching may be performed using fluorine plasma in one or more embodiments, for example, using CF4 or NF3 source gas. After etching the hard mask layer 30, any remaining photoresist layer may be removed using a resist stripping process.

Alternatively, other etch processes may also be used to form the trenches 40. In various embodiments, the hard mask layer 30 may include more than one layer and may include different material layers.

Further, the figures only show a part of the substrate 10 and similar additional structures may be duplicated across the substrate 10.

Figure 2B:
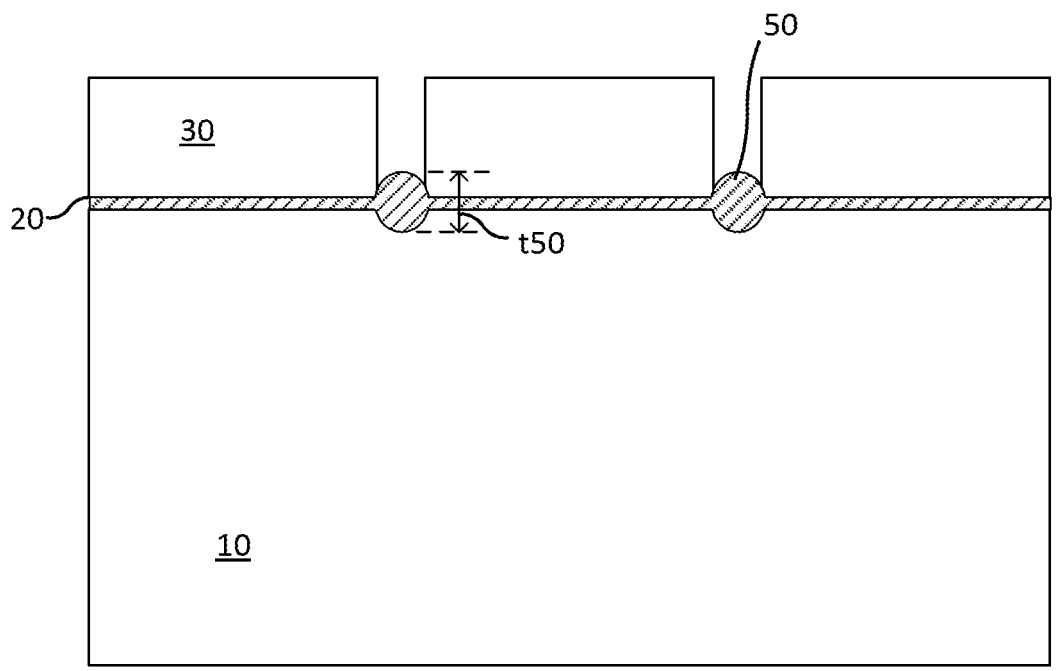

FIG. 2B illustrates a semiconductor structure after the formation of local oxidation regions in accordance with embodiments of the present invention.

The substrate 10 is exposed to an oxidizing ambient so as to oxidize the exposed surfaces of the substrate 10. The hard mask layer 30 on the surface of the substrate 10 prevents regions of the substrate 10 covered by the hard mask layer 30 from oxidizing. This produces a thicker silicon dioxide layer (for a substrate 10 of silicon as an example) locally on the surface of the substrate 10. The function of the hard mask layer 30 is to block oxidation from occurring whenever it is present. However, some portion of the substrate 10 under the hard mask layer 30 is oxidized as the oxygen atoms diffuse through the pad oxide 20 and oxidize the surface of the substrate 10 underneath it. This results in the formation of masking structure 50 having a bird's beak shaped profile.

In various embodiments, the thickness of the pad oxide 20 and the hard mask layer 30 may be controlled to engineer the lateral encroachment of the oxide under the hard mask layer 30. In various embodiments, the local oxidation process might be performed at about 950° C. to about 1150° C., for example about 1050° C. in one embodiment. In various embodiments, the local oxidation process might be performed for 20 minutes to about 120 minutes, and about 60 minutes in one embodiment. In various embodiments, the thickness of the masking structure 50 (t50) is about 50 nm to 500 nm.

Figure 2C:
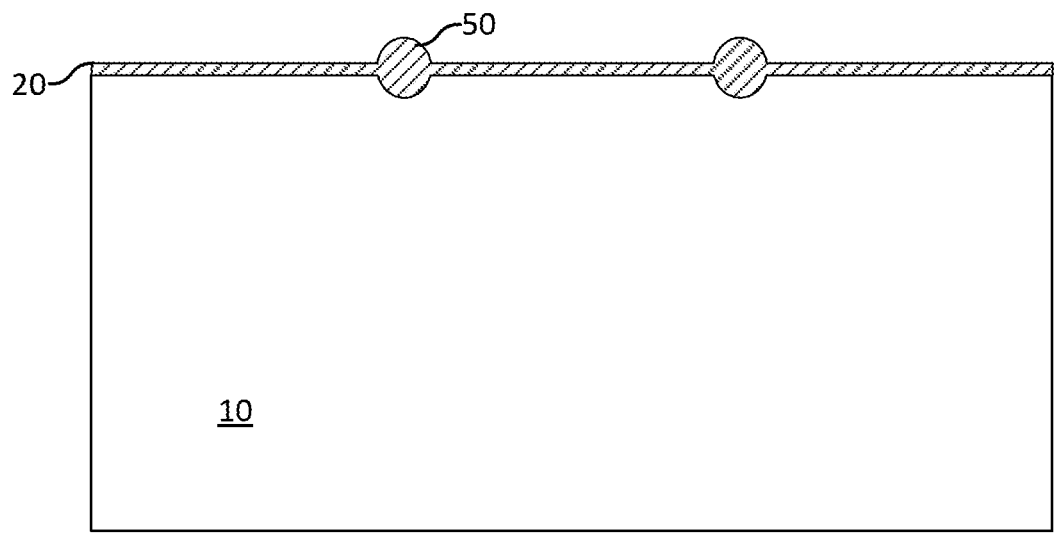

FIG. 2C illustrates the semiconductor structure after removing the hard mask layer in accordance with embodiments of the present invention. As illustrated next in FIG. 2C, the hard mask layer 30 is removed. In various embodiments, the hard mask layer 30 may be removed using an etching process such as a wet etch process. The etching process may be designed to stop on the pad oxide 20 in one or more embodiments.

Figure 2D:
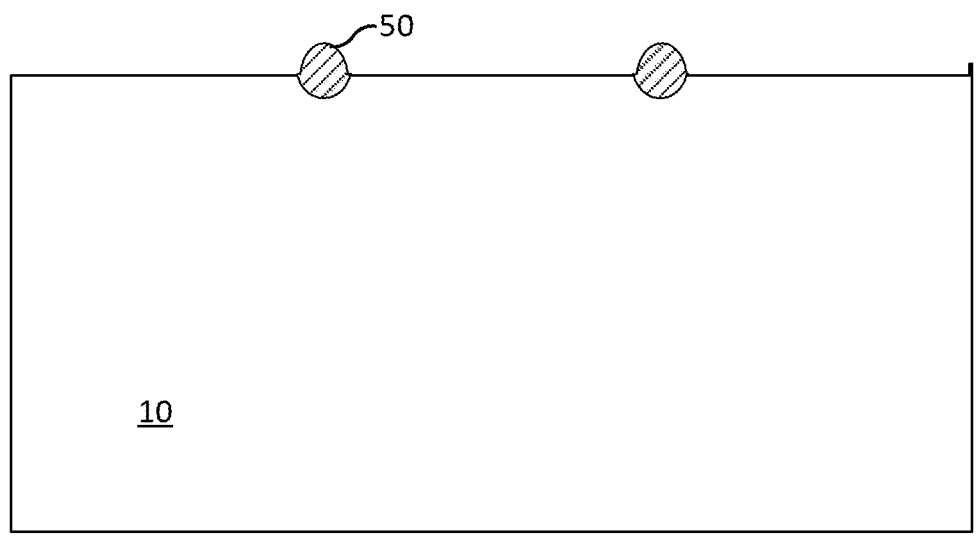

FIG. 2D illustrates the semiconductor structure after removing the pad oxide in accordance with embodiments of the present. In various embodiments, the pad oxide 20 may be removed, for example, using an etching process. In one or more embodiments, the etching process may be a wet etch process that is performed as a blanket etch process. After the completion of the etch process, only the masking structure 50 is present over the substrate 10.

Figure 2E:
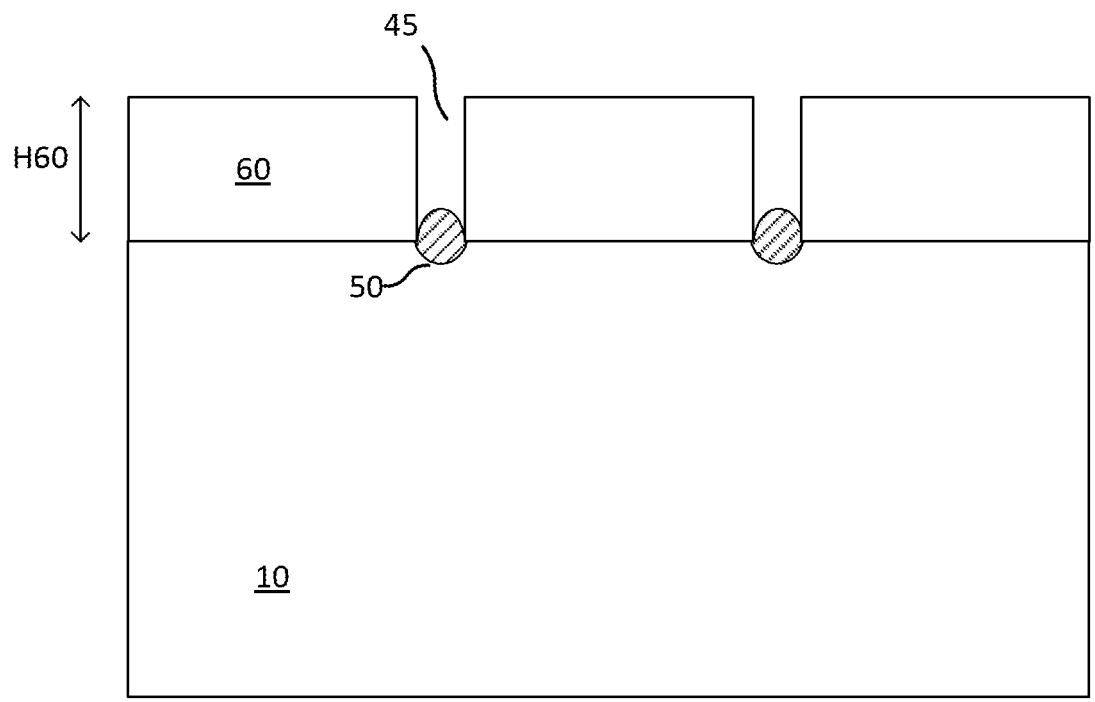
Figure 2G:
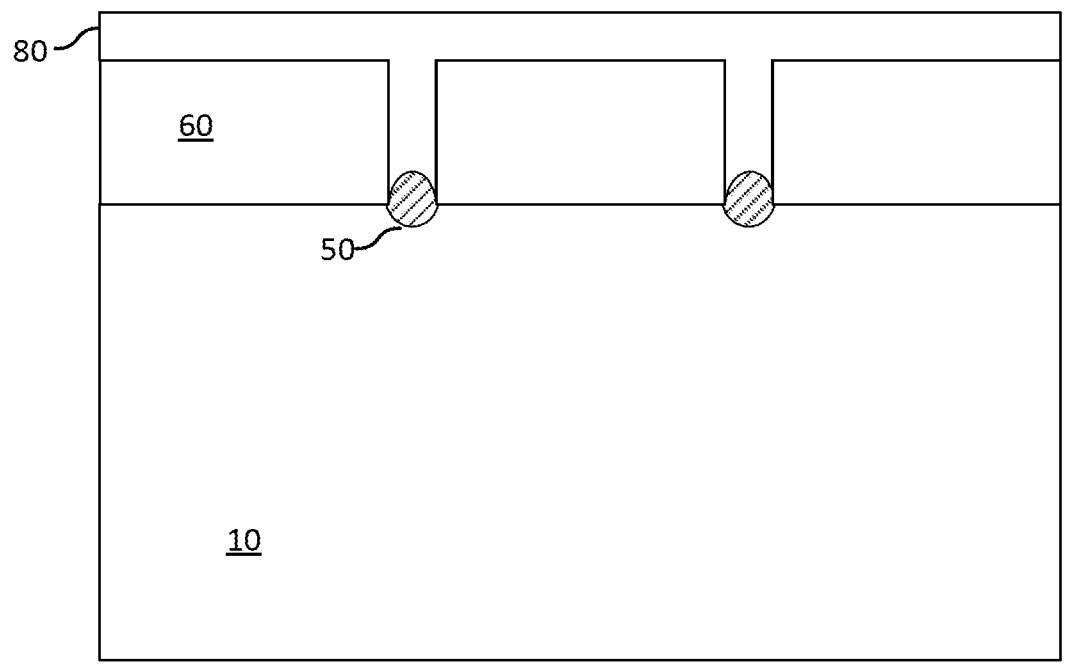
Figure 2F:
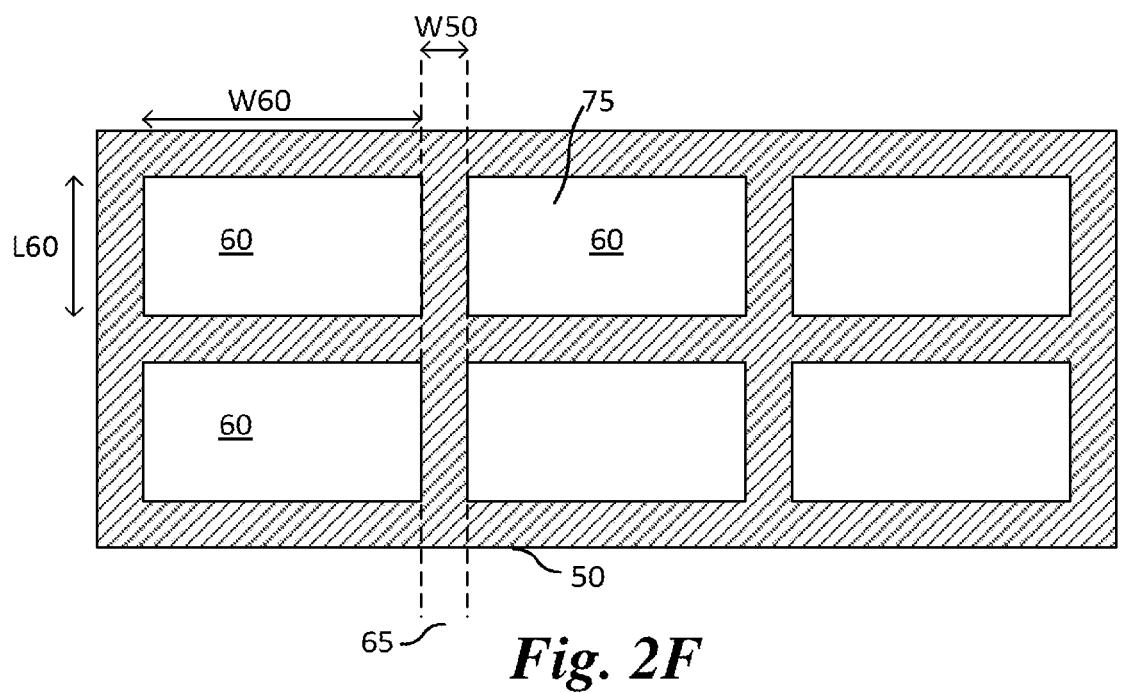

FIG. 2E illustrates a cross-sectional view of the semiconductor structure after the completion of a selective epitaxial process in accordance with embodiments of the present invention and FIG. 2F illustrates a top view of the corresponding structure.

In one or more embodiments, the substrate 10 is exposed to a selective epitaxial process. In various embodiments, the epitaxial process may be performed in a selective way such that no deposition occurs on masking structure 50. In various embodiments, the epitaxial process arranges atoms of the material being deposited on the substrate 10 and takes the crystalline form of the substrate 10. In various embodiments, epitaxial process may be any process producing oriented growth of a monocrystalline material on another monocrystalline material. In various embodiments, the epitaxial process may be deposited using various deposition techniques such as metalorganic vapour phase epitaxy (MOVPE), metalorganic chemical vapor deposition (MOCVD), molecular beam epitaxy (MBE), and hydride vapour phase epitaxy (HVPE), other types of chemical vapor deposition, and other deposition processes.

In various embodiments, the epitaxial process may deposit one or more layers of silicon, silicon germanium, silicon carbide, gallium nitride, aluminum nitride, indium phosphide, indium arsenide, indium antimonide, gallium arsenide, aluminum gallium nitride, indium gallium nitride, and combinations thereof. Other examples include compound semiconductors such as group III nitride semiconductors. In various embodiments, the epitaxial process may be a heteroepitaxial process.

As an example, silicon epitaxy may be performed by decomposing silane or chloride sources such as silicon chloride. Similarly, silicon carbide may be deposited using silane in combination with light hydrocarbons, such as propane or ethylene. As another example, gallium nitride may be deposited using a gallium precursor such as gallium chloride in combination with a source of nitrogen such as ammonia.

The epitaxial process may be performed at about 600° C. to about 1000° C. in various embodiments. In alternative embodiments, lower temperatures may be used. Higher temperatures may provide faster deposition rates but may also result in more defective layers and/or result in unwanted depositions on masking structure 50.

In various embodiments, the portion of the substrate 10 covered by the masking structure 50 do not grow or form any epitaxial layers. As a consequence, the masking structure 50 masks the substrate 10 during the epitaxial regrowth process. As illustrated in FIG. 2E, the selective epitaxial layer 60 includes mesas formed using the epitaxial process separated by the masking structure 50. The mesas are separated by trenches 45 whose bottom surfaces are formed by the masking structure 50. The thickness of the epitaxial layer may be, for example, as shown in FIG. 2E, larger than the thickness of the masking structure 50. Alternatively, the thickness of the epitaxial layer may be smaller or approximately the same compared to the thickness of the masking structure 50, for example, to prevent lateral growth of the epitaxial layer.

A top view of the semiconductor structure at this stage of processing is illustrated in FIG. 2F. As illustrated in FIG. 2F, in various embodiments, advantageously, the selective epitaxial layer 60 is not formed over regions of the substrate 10 that are part of the dicing region 65, which may be also called as kerf, dicing channel, dicing streets, or scribe lines. Rather, the selective epitaxial layer 60 is formed only over the semiconductor chip regions 75.

In various embodiments, the epitaxial layers 60 may have a thickness (H60) of about 100 nm to about 1 μm. In various embodiments, and in particular for embodiments, where the epitaxial deposited material corresponds to the substrate material, the epitaxial layers 60 may have a thickness (H60) of about 500 nm to about 10 μm or even 200 μm. The thickness H60 of the selective epitaxial layer 60 may—for the case of the epitaxial deposition of a material on the substrate 10 which is different to the substrate material—depend on the lattice mismatch between the crystalline form substrate 10 and the material being grown. Advantageously, the critical thickness of the selective epitaxial layer 60 that may be grown before forming dislocations and other defects is much higher than growing the same epitaxial layer over a blanket substrate, e.g., having no masking structure 50. This is because the selective epitaxial layer 60, which is formed as a mesa, may laterally relax the excess strain due to lattice mismatch. Additionally, relative to a blanket deposition of the epitaxial layer, the total strain energy in the layer being grown is much lower. The total strain energy depends on the volume of the material being grown (height H60×width W60×length L60). As the width W60 and the length L60 are made much smaller than a blanket epitaxial process, the height H60 may be increased without forming any defects. Accordingly, embodiments of the present invention enable the formation of the high quality epitaxial layers even when materials with large mismatch are grown. In contrast, thick epitaxial layers when deposited as a blanket layer may form cracks and/or sliplines during deposition. For example, GaN layers more than a few hundred nanometers when grown as a blanket layer may crack on cooling down to room temperature due to the large lattice mismatch (about 2.4%) and large differences in thermal expansion coefficients in the case of Si substrate.

Nevertheless, embodiments of the present invention may include one or more buffer layers between the selective epitaxial layer 60 and the substrate 10. Additionally in various embodiments, the selective epitaxial layer 60 may be graded. For example, the amount (e.g., fractional atomic percent) of one element in the material being deposited may be varied with thickness so that the strain energy is gradually increased from the interface of the substrate 10 (or buffer layer if present) and the selective epitaxial layer 60. For example, after growing a heavy doped drift region, a low doped channel region of the opposite doping may be grown, following by growing a source region. Alternatively, in some embodiments, different layers of the selective epitaxial layer 60 may be grown using different composition to module the strain and band gap within each layer. For example, the drift zone of a first epitaxial material may be grown over which the channel or base region may be grown having a different epitaxial material.

It is understood that the selective epitaxial layer 60 may grow in a faceted manner, i.e., certain crystal planes may grow faster than others, which can result in the lateral encroachment of the selective epitaxial layer 60 above the masking structure 50. Accordingly, the lateral distance or width W50 and the thickness t50 of the masking structure 50 (FIG. 2F) has to be predetermined (for a given thickness H60 of the selective epitaxial layer 60) so that adjacent mesas do not merge. For example, half the thickness of the selective epitaxial layer 60 measured from the top surface of the masking structure 50 (H60−W50) is less than half the width of the masking structure (W50), i.e., ½ (H60−W50)<½ W50.

In one or more embodiments, the selective epitaxial layer 60 is grown on a silicon (100) surface. In other embodiments, the selective epitaxial layer 60 may be grown on other silicon planes such as (110) or (111).

Additionally, the selective epitaxial layer 60 may introduce impurities as well as dopants during the deposition process. For example, dopants may be added in-situ during the epitaxial deposition process.

FIG. 2G illustrates a cross-sectional view of the semiconductor structure after an overfill process in accordance with embodiments of the present invention. The fill material 80 is deposited within the trenches 45 (FIG. 2E) formed between the adjacent mesas of the selective epitaxial layer 60. In various embodiments, the fill material 80 may comprise a mixture of one or more elements of silicon, carbon, oxygen, nitrogen, hydrogen, fluorine.

In various embodiments, the fill material 80 may be a spin on dielectric such as a glass. In alternative embodiments, the fill material 80 may be an oxide layer such as tetraethyl orthosilicate (TEOS) oxide. In alternative embodiments, the fill material 80 may comprise a low-k material. The fill material 80 may be deposited using chemical or physical vapor deposition or spin coating, for example, low pressure chemical vapor deposition (LPCVD), plasma enhanced chemical vapor deposition (PECVD), high density plasma vapor deposition or other vapor deposition in various embodiments.

In alternative embodiments, the fill material 80 may comprise carbon based materials such as amorphous carbon (e.g., hydrogenated amorphous carbon, tetrahedral amorphous carbon, or a mixture thereof), polycrystalline carbon, carbon composites, fluorinated carbon, and combinations thereof.

Figure 2H:
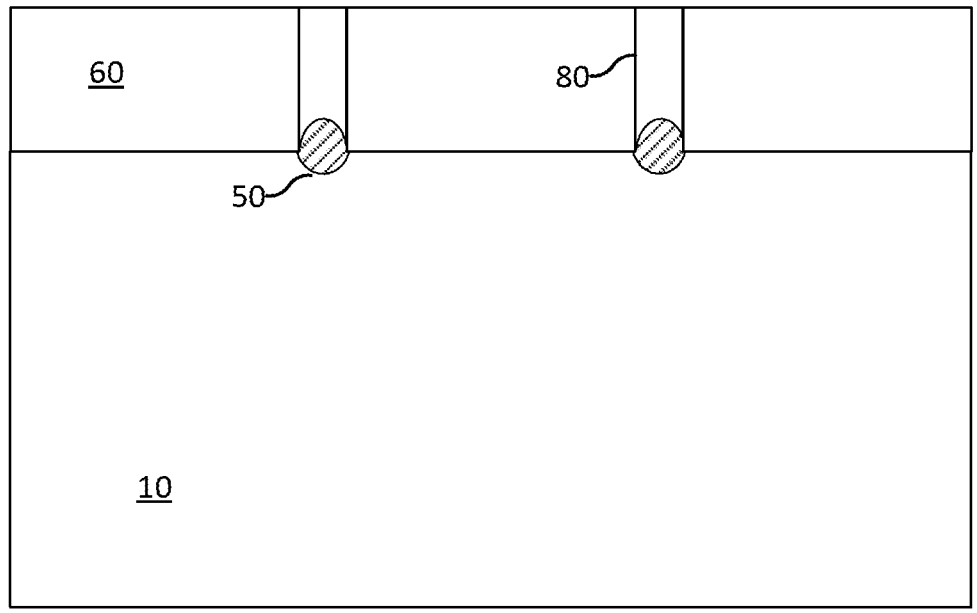

FIG. 2H illustrates a cross-sectional view of the semiconductor structure after a planarization process in accordance with embodiments of the present invention.

In various embodiments, the fill material 80 may be planarized or polished so that the top surface of the selective epitaxial layer 60 is exposed. In various embodiments, the fill material 80 may be planarized using a chemical mechanical polishing (CMP) process or other suitable techniques.

Figure 2I:
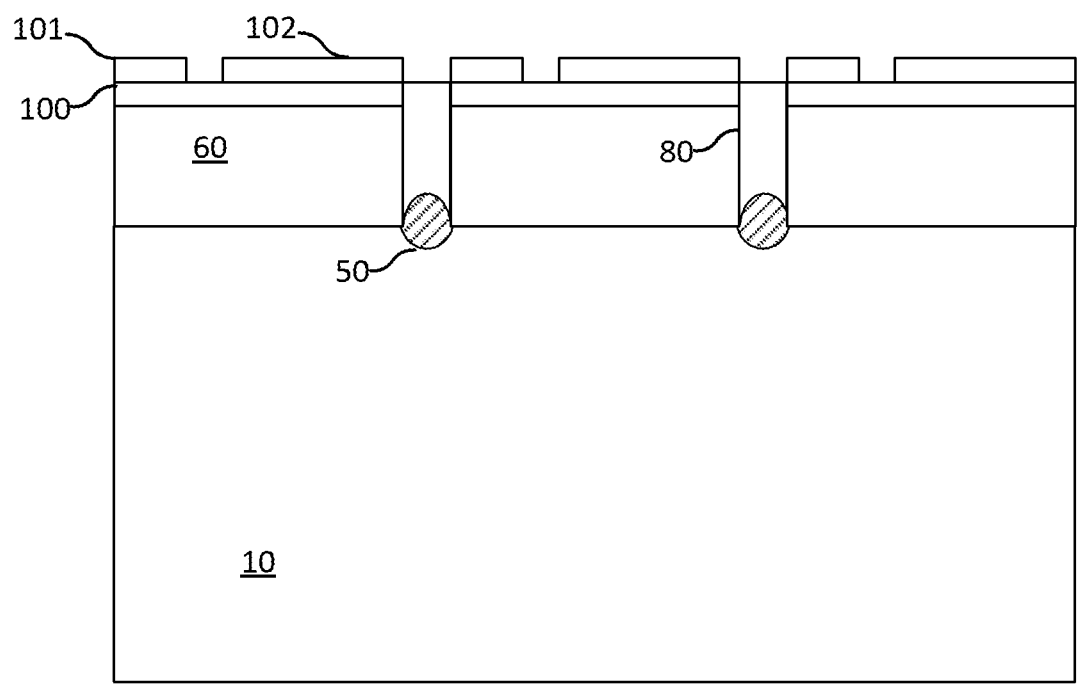

FIG. 2I illustrates a cross-sectional view of the semiconductor structure after forming front end of line and back end of line processing in accordance with embodiments of the present invention.

After the planarization process, the exposed semiconductor region of the selective epitaxial layer 60 is treated to form device regions 100. The formation of the device regions 100 may form doped regions for forming transistors, power MOSFETs, IGBTs, diodes, thyristors, triacs, and other types of devices. In one embodiment, a plurality of vertical transistors is formed in the selective epitaxial layer 60, for example, a power semiconductor device. After forming the device regions 100, contact regions, plugs, and interconnect metallization may be formed over the device regions 100. The interconnect metallization may include the formation of contact pads. For example, FIG. 2I illustrates a first contact pad 101 and a second contact pad 102. In one embodiment, the first contact pad 101 is a gate contact pad and the second contact pad 102 is a source contact pad of a discrete transistor.

Figure 2J:
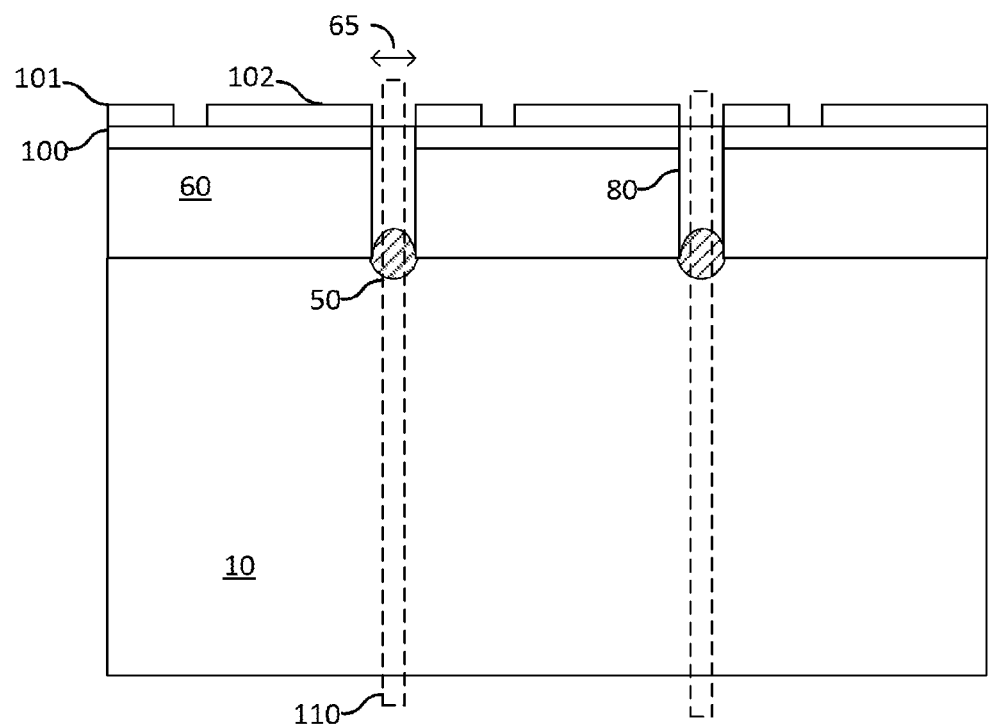
Figure 2K:
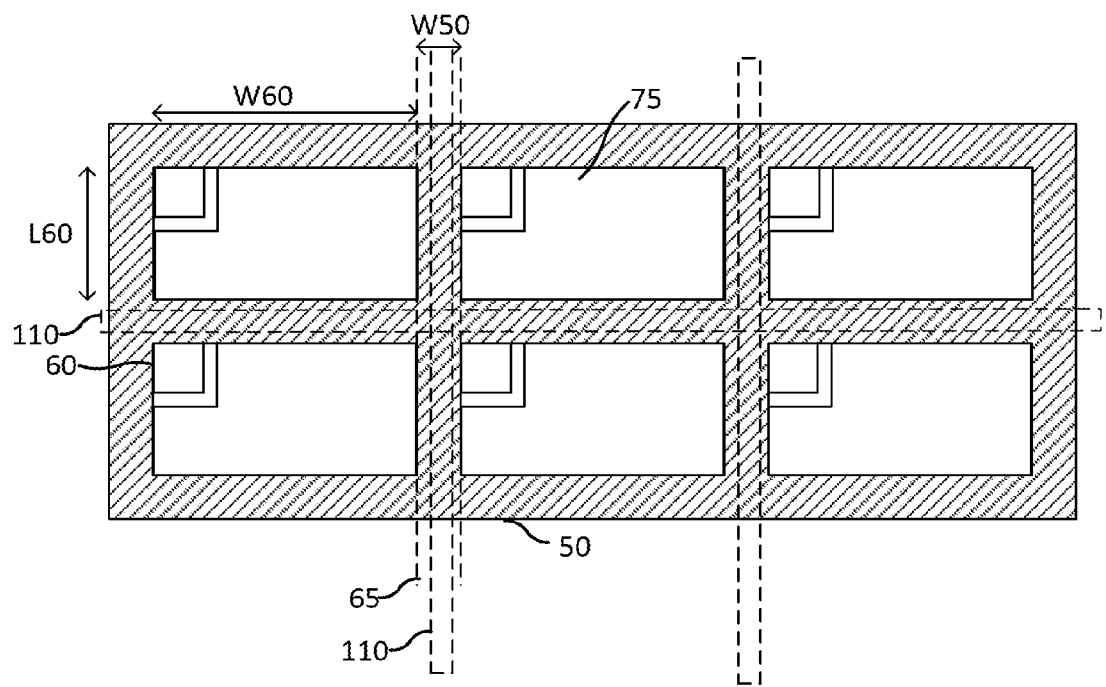

FIG. 2J illustrates a cross-sectional view of the semiconductor structure after singulation in accordance with embodiments of the present invention. FIG. 2K is a top view of the corresponding structure illustrated in FIG. 2J.

Dicing is performed through the dicing regions 65. In particular, a dicing blade cut through separation regions 110, which are narrower than the width of the dicing regions 65. The separation regions 110 are the regions through which the dicing blade passes through. Alternatively, separation regions 110 may be the region over which a crack is formed in a stealth laser dicing process, or an opening is formed in a plasma etching process.

As described above, the masking structure 50 covers the dicing regions 65. Additionally, and consequently, the separation regions 110 are narrower than the masking structure 50. Therefore, the dicing blade cuts only through the masking structure 50 but not the selective epitaxial layer 60. In various embodiments, singulation is achieved without any cutting through the selective epitaxial layer 60. This avoids crack propagation from the sidewalls of the singulated semiconductor die. This is especially advantageous in case of harder materials such as silicon carbide and gallium nitride. Further, the thermal oxide regions of the masking structure 50, which are strongly bound to the silicon atoms of the substrate 10, do not chip even though they may be subjected to the dicing actions. If the active device is thick enough, it is also possible, to remove the substrate 10 by backside thinning techniques so that a further singulation process by dicing or a laser process is not necessary for the case that the trenches 40 are not filled with material. For the case that the filling is aSiO$_2$-layer, the singulation may be performed by means of an etching step.

FIG. 3, which includes FIGS. 3A-3D, illustrates a semiconductor device during various stages of fabrication in accordance with alternative embodiments of the present invention.

Figure 3A:
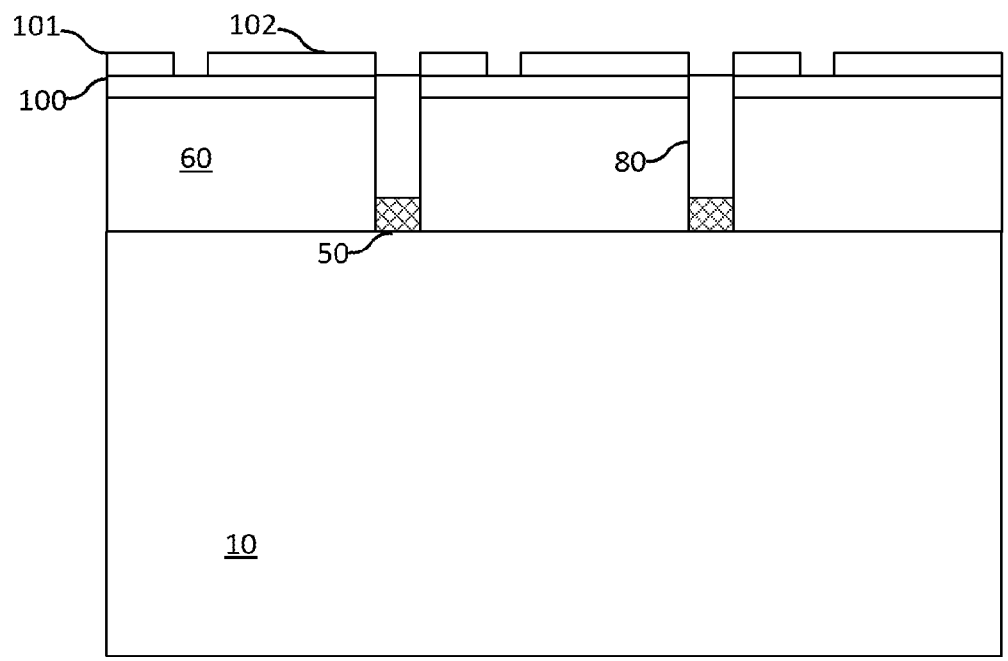
FIGS. 3A-3D, illustrates a semiconductor device during various stages of fabrication in accordance with alternative embodiments of the present invention.

Referring to FIG. 3A, the alternative masking structure 50 is formed using a masking process. For example, instead of being formed using a thermal oxidation process as in the prior embodiment, in this embodiment, the masking structure 50 may be deposited after step shown in FIG. 2A. Subsequent processing may follow as described in FIGS. 2C-2I.

Figure 3B:
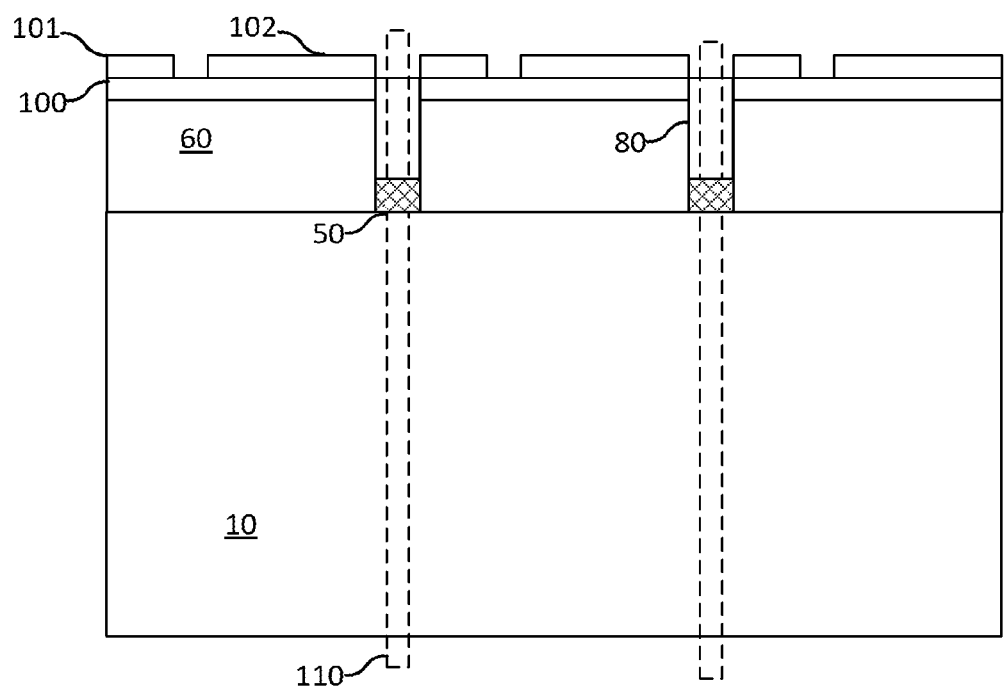
Figure 3C:
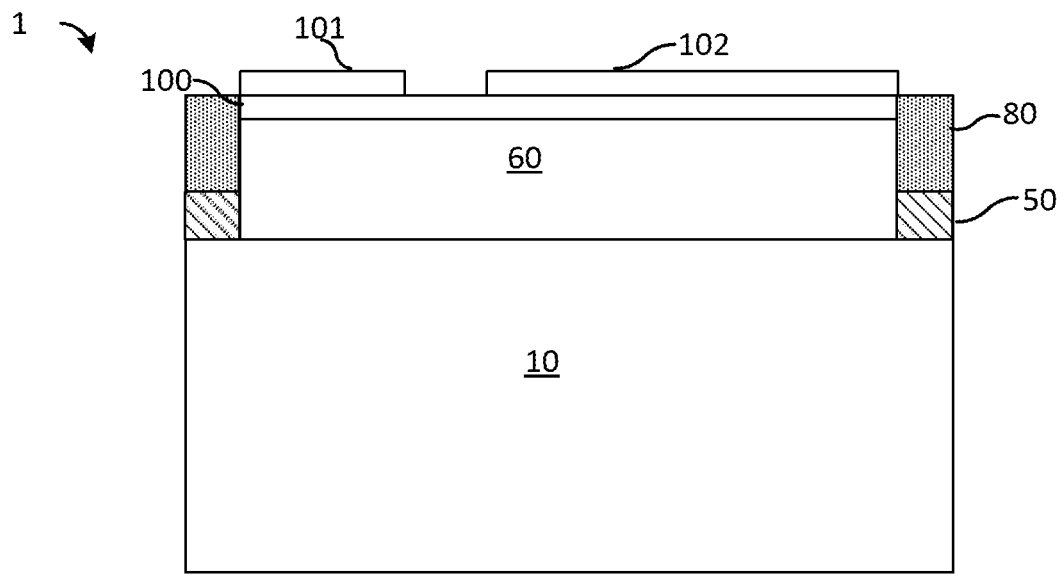

Referring to FIG. 3B, in various embodiments, the dicing process may be performed as in prior embodiments. As in prior embodiments, the dicing blade cuts only through the masking structure 50 and not the selective epitaxial layer 60. FIG. 3C illustrates the semiconductor structure after the dicing process.

Figure 3D:
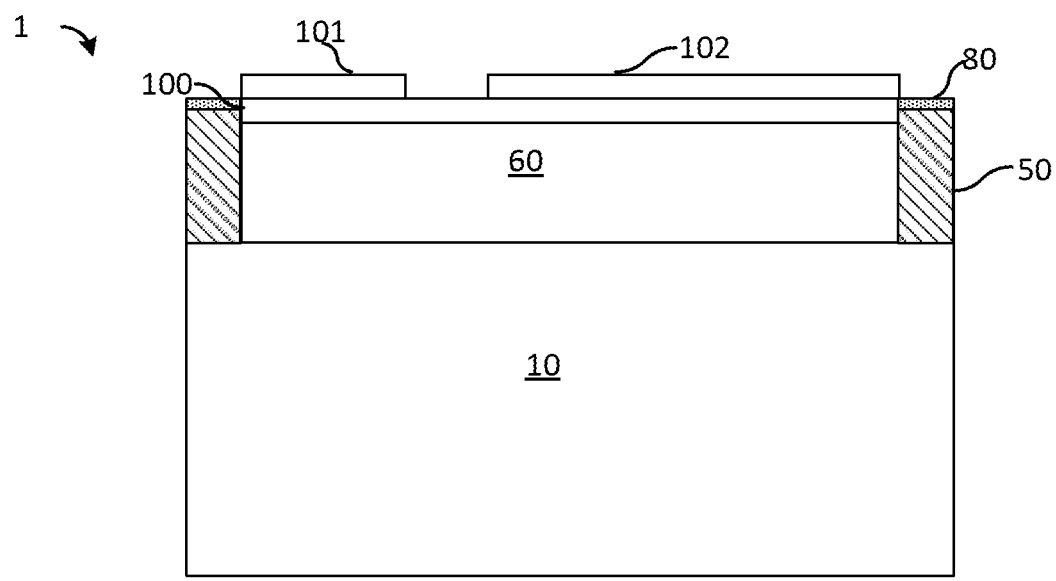

FIG. 3D illustrates an alternative embodiment in which the masking structure 50 substantially covers the sidewall of the selective epitaxial layer 60. Here, the thickness of the masking structure 50 is substantially similar to the thickness of the subsequently deposited selective epitaxial layer 60. In such cases, the fill material 80 may not be needed but although may be used to form a planar structure.

Figure 4A:
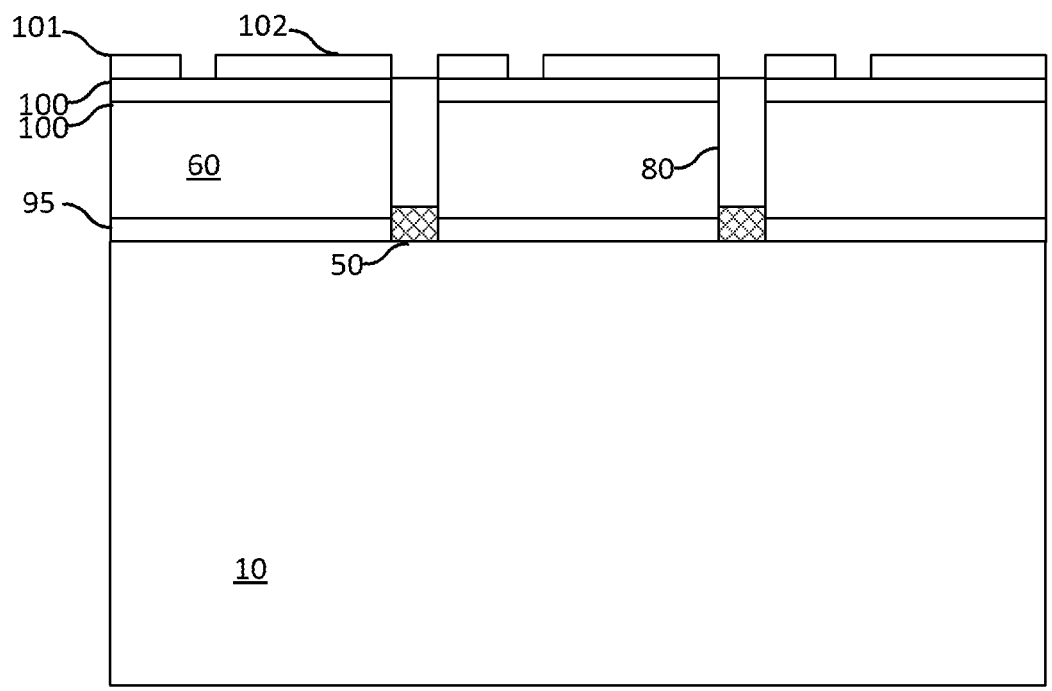
FIGS. 4A-4C, illustrates a semiconductor device during various stages of fabrication in accordance with alternative embodiments of the present invention.
Figure 4B:
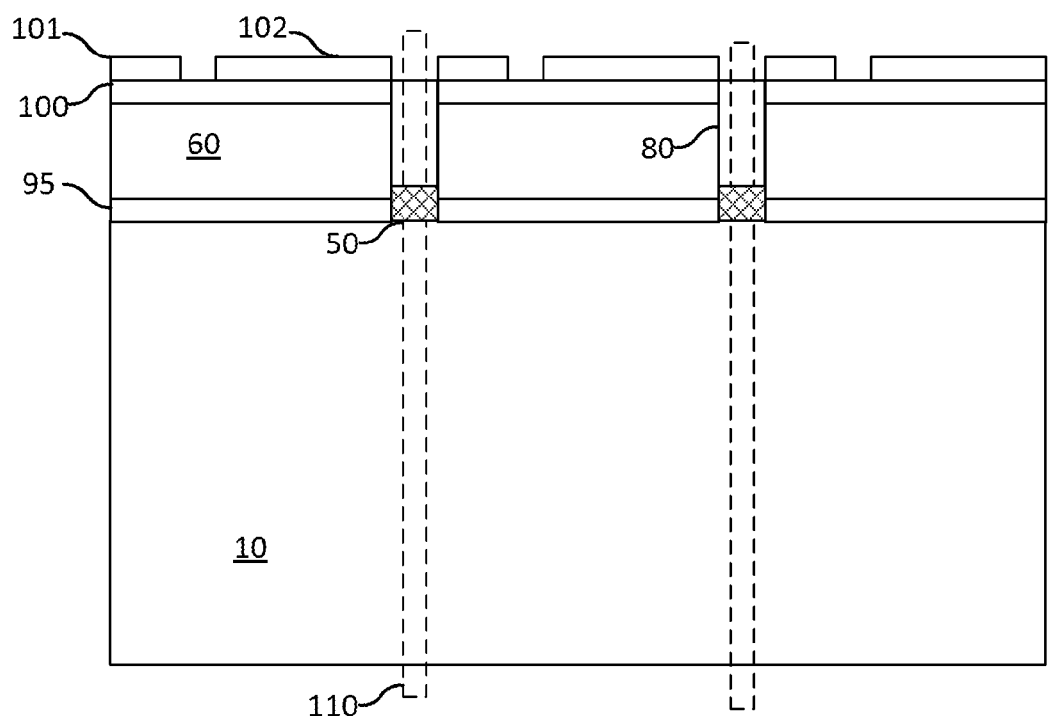
Figure 4C:
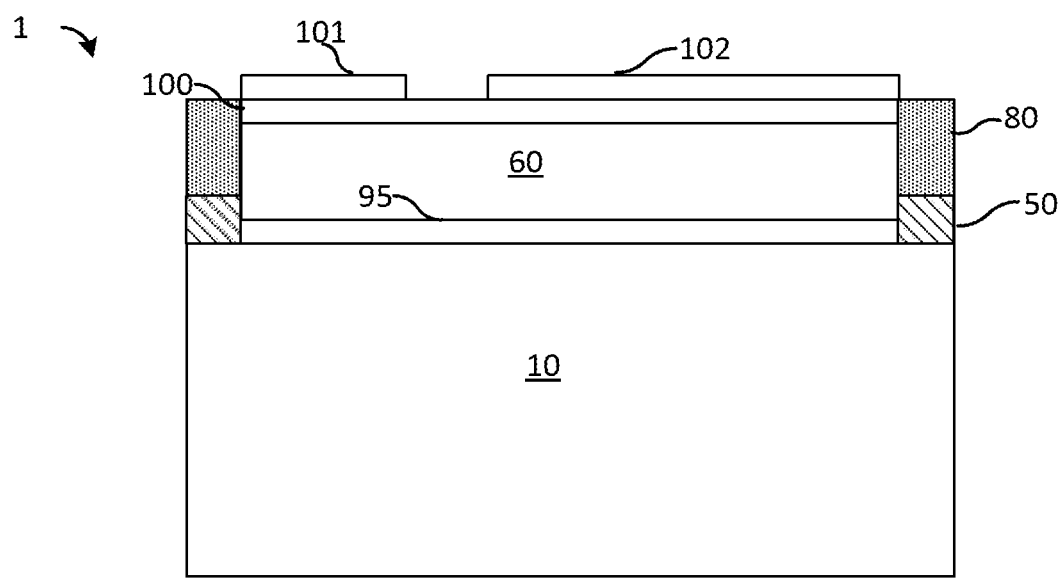

FIG. 4, which includes FIGS. 4A-4C, illustrates a semiconductor device during various stages of fabrication in accordance with alternative embodiments of the present invention.

In various embodiments, the selective epitaxial layer 60 may be formed after depositing a buffer layer 95. The buffer layer 95 may be used to reduce the strain intensity at the interface between the selective epitaxial layer 60 and the substrate 10. The buffer layer 95 also behaves as a seed layer for subsequent epitaxial process. In various embodiments, the buffer layer 95 may be chosen such that the lattice mismatch between the buffer layer 95 and the substrate 10 is less than the lattice mismatch between the selective epitaxial layer 60 and the substrate 10. For example, while depositing a selective epitaxial layer 60 comprising gallium nitride, a buffer layer 95 that includes hafnium nitride or aluminum nitride may be deposited. Similarly, while depositing a selective epitaxial layer 60 comprising silicon carbide, a buffer layer 95 comprising lower percentage carbon may be grown prior to growing the desired silicon carbide epitaxial layer. For example, in various embodiments, the buffer layer may be grown using a slower growth and/or a lower carbon concentration in the source gas chemistry.

Subsequent processes may follow the descriptions described in various embodiments. In one embodiment, the subsequent processes may follow the process steps associated with FIGS. 2A-2I resulting in the structure illustrated as FIG. 4A. As an illustration, the masking structure described in FIG. 3 is also illustrated. However, embodiments of the invention could also include the thermal oxide-based masking structure 50 as shown in FIG. 2. Referring to FIG. 4B, the substrate 10 may be singulated as described in prior embodiments. A semiconductor chip 1 formed after the singulation is illustrated in FIG. 4C.

FIG. 5, which includes FIGS. 5A-5E, illustrates a semiconductor device during various stages of fabrication in accordance with an alternate embodiment of the present invention.

Figure 5A:
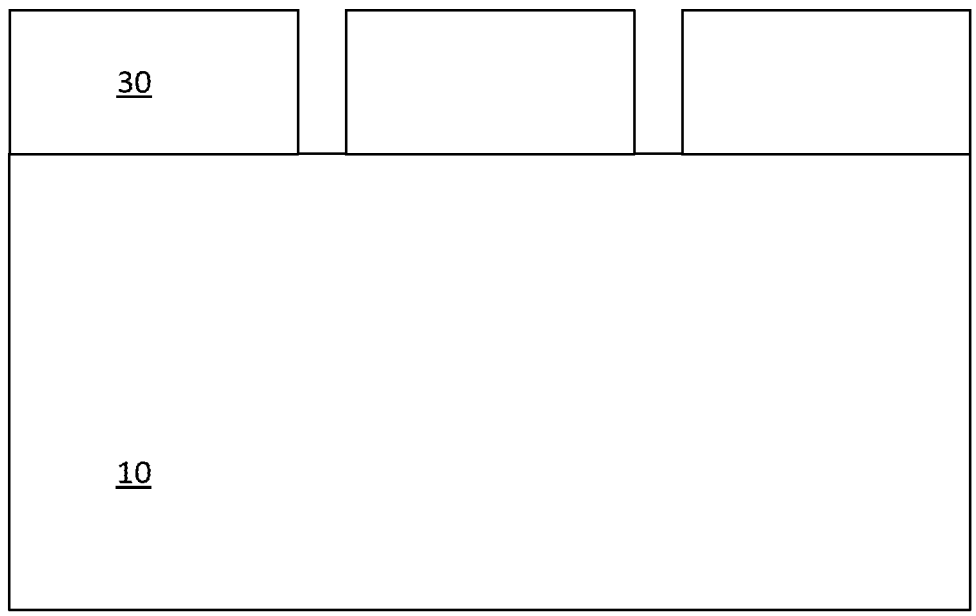
FIGS. 5A-5E, illustrates a semiconductor device during various stages of fabrication in accordance with an alternate embodiment of the present invention.
Figure 5B:
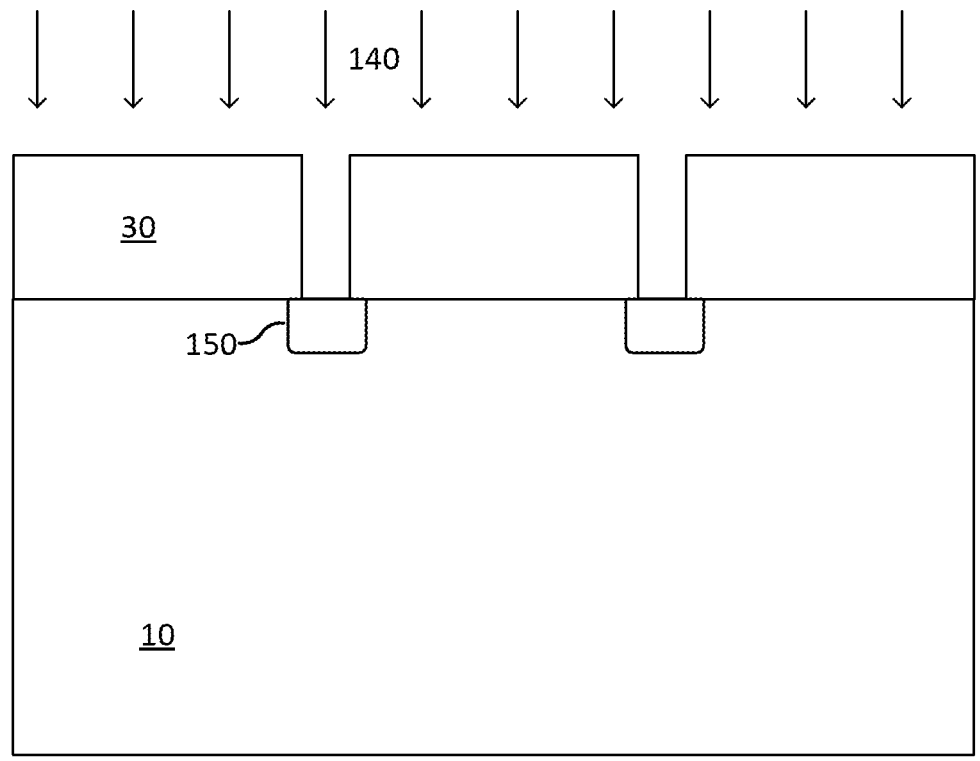

In this embodiment, the substrate 10 is masked by damaging the exposed surface of the substrate 10 so that subsequent epitaxial growth is inhibited. As an illustration, FIG. 5A illustrates a semiconductor structure after depositing and patterning a hard mask layer 30 over the substrate 10. Alternatively, in some embodiments, the hard mask layer 30 may be skipped and a photo resist layer may be sufficient.

A damaging process 140 is performed into the substrate 10. In one embodiment, the damaging process 140 comprises an ion implantation step. For example, the ion implantation process may form an amorphous region (damage region 150) at the top surface of the substrate 10. The amorphous region prevents subsequent epitaxial regrowth. In various embodiments, the ion implantation process may introduce impurities or dopants that inhibit epitaxial regrowth or just result in a mechanical damage by, e.g., argon implantation or by other inert elements.

Alternatively, other types of damage inducing processes may be used. For example, in an embodiment, plasma damage may be used to form the damage region 150. In another embodiment, an irradiation process such as an ultraviolet treatment may be performed to form the damage region 150.

Figure 5C:
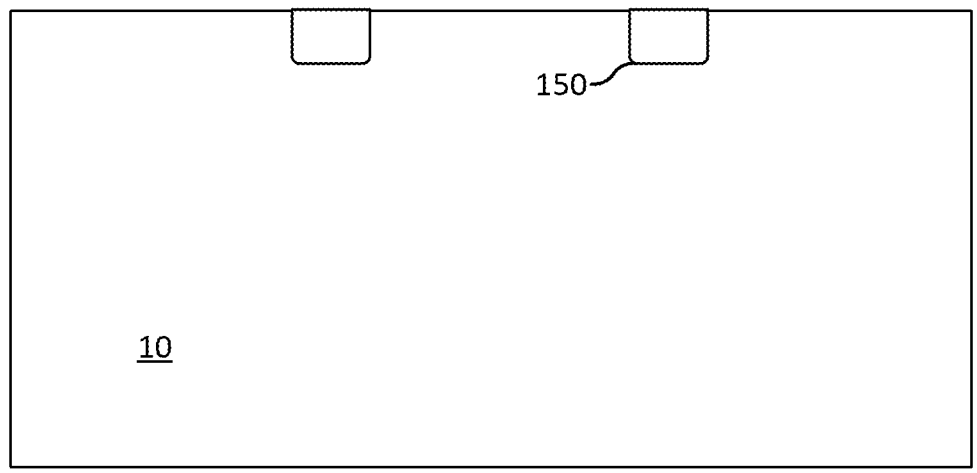
Figure 5D:
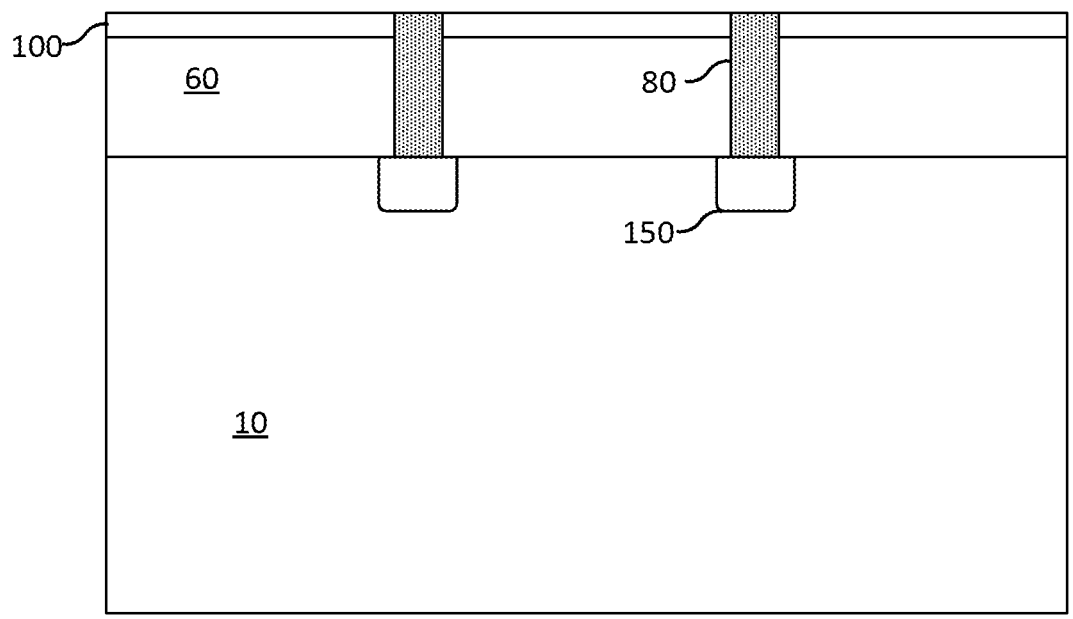
Figure 5E:
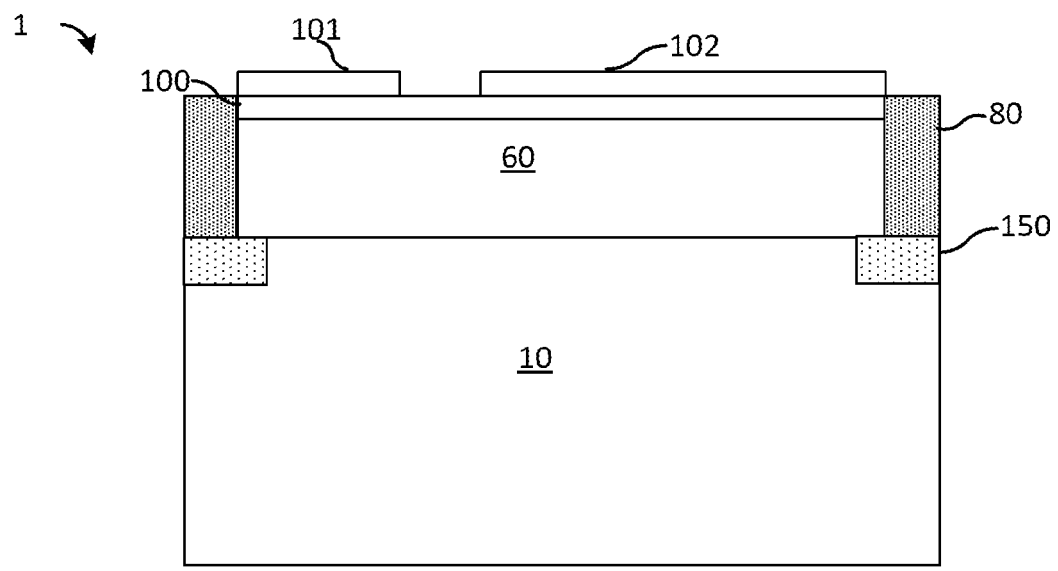

Referring to FIG. 5C, the hard mask layer 30 is removed, for example, using a wet etch process. In case, a photo resist layer was used instead of the hard mask layer 30, a resist stripping process may be sufficient to remove the photo resist layer. Referring next to FIG. 5D, as described in prior embodiments, an optional buffer layer (not shown, see FIG. 4), and a selective epitaxial layer 60 may be formed. Additional device regions 100 and subsequent metallization may be formed as described in other embodiments. The substrate 10 may be singulated as described in prior embodiments. As in prior embodiments, the separation region of the dicing blade (or equivalents) cuts through the damage region 150 but not the selective epitaxial layer 60. FIG. 5E illustrates a semiconductor chip 1 after the singulation process. As described in prior embodiments, the exposed sidewall of the semiconductor chip 1 includes a portion of the damage region 150, the fill layer 80, and the substrate 10.

FIG. 6, which includes FIGS. 6A-6M, illustrates a semiconductor device during various stages of fabrication in accordance with embodiments of the present invention.

Figure 6A:
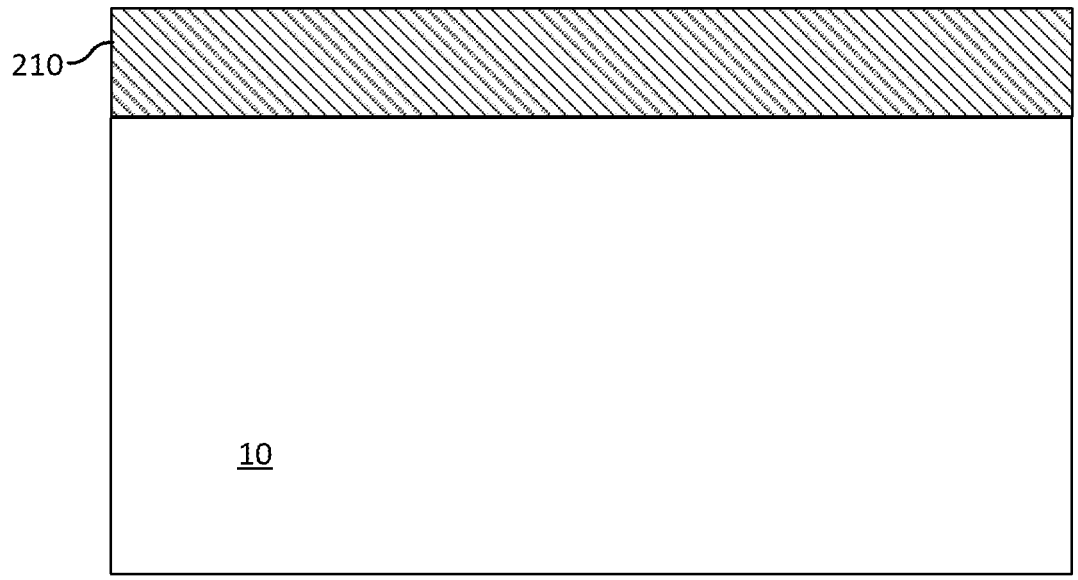
FIGS. 6A-6M, illustrates a semiconductor device during various stages of fabrication in accordance with alternative embodiments of the present invention.

FIG. 6A illustrates a substrate 10 coated with the thick separation layer 210. The substrate 10 may be a silicon substrate as described in various other embodiments. The separation layer 210 may comprise silicon oxide layer and or silicon nitride layer in various embodiments. In one or more embodiments, the separation layer 210 may be a field oxide layer produced via a high-temperature thermal oxidation process. For example, the separation layer 210 may be produced using an oxidation process at about 900° C. to about 1150° C. Alternatively, other deposition techniques may be used to form the separation layer 210.

Advantageously, the separation layer 210 is able to withstand front end processing temperatures. In various embodiments, the thickness of the separation layer 210 may be chosen depending on the type of device being fabricated. As will be apparent from the processing below, the thickness of the separation layer 210 is an important factor in determining the final thickness of the semiconductor chip that is being fabricated. For example, low-voltage devices may require only about 5 µm to about 20 µm thick separation layer 210. In contrast, higher voltage devices may use about 20 µm to about 190 µm thick separation layer 210.

Figure 6B:
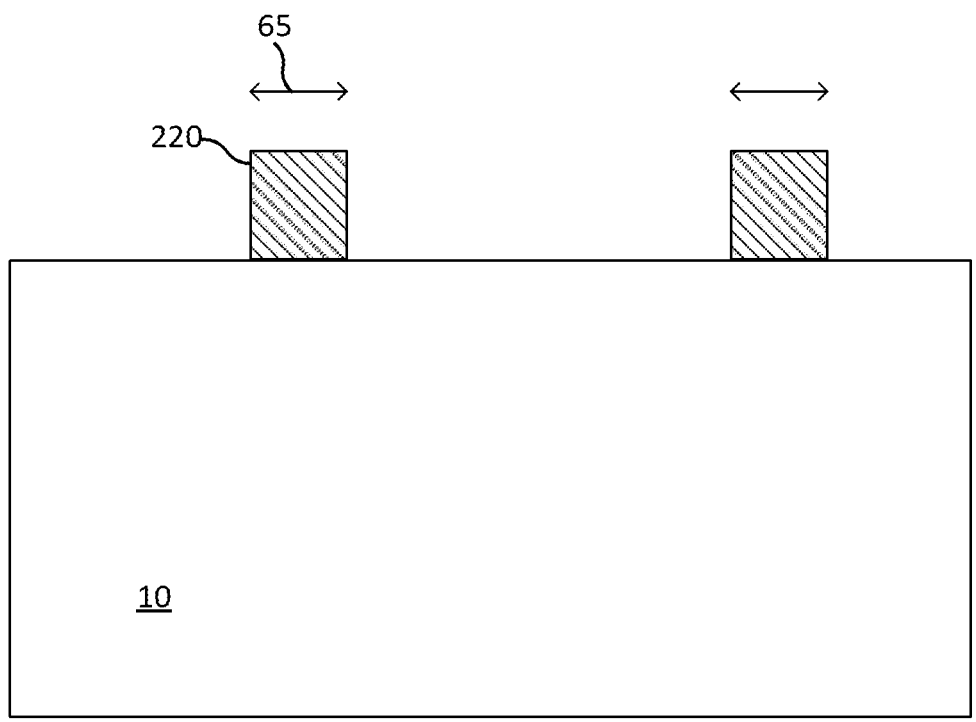

Referring next to FIG. 6B, the separation layer 210 is patterned to form a structured separation layer 220. In various embodiments, the separation layer 210 may be patterned to open the active areas of the chip being fabricated. In various embodiments, the separation layer 210 is patterned such that the separation layer 210 is not removed in areas above the dicing regions 65.

Figure 6C:
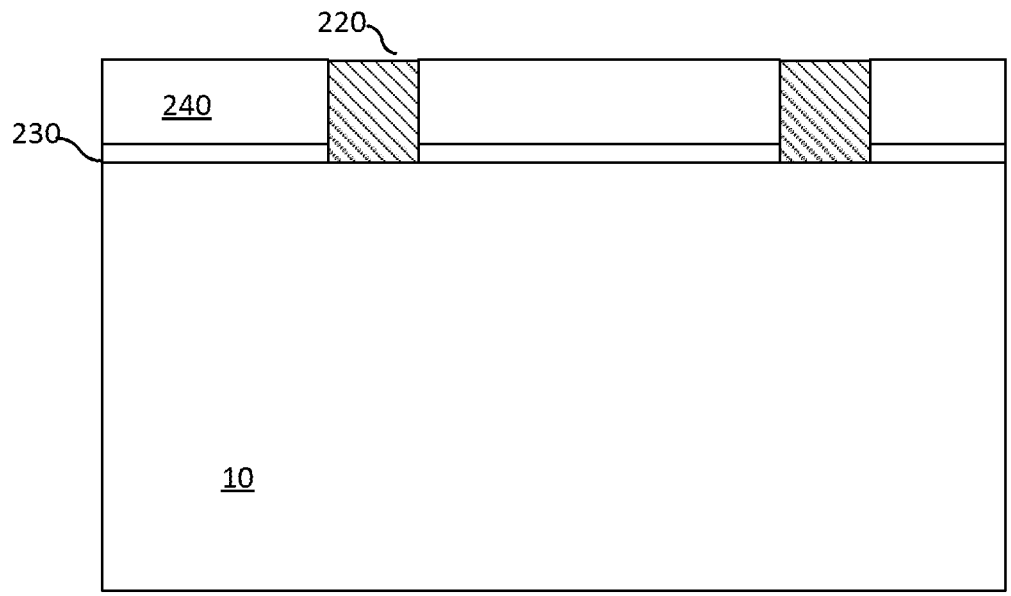

Referring next to FIG. 6C, a selective epitaxial deposition process is performed. First, the highly doped epitaxial layer 230 with the same doping type of the drift layer of the device is grown over the exposed top surface of the substrate 10. The doping content of the highly doped epitaxial layer 230 may be chosen so as to improve the ohmic contact resistance of the contact to the back side. A high doping reduces the contact resistance. Alternatively an emitter layer with the opposite doping type of the drift layer can be deposited on the substrate.

Next, a lower doped epitaxial layer 240 is grown over the highly doped epitaxial layer 230. The lower doping of the lower doped epitaxial layer 240 enables the formation of different doped regions within the lower doped epitaxial layer 240. For example, as described in prior embodiments, the device regions may be formed at a top surface of the lower doped epitaxial layer 240. Optionally, a field stop or buffer layer with a doping level higher than the doping of the epitaxial layer 240 and lower than that of the highly doped epitaxial layer 230 can be implemented between these two layers.

A planarization process may be performed to polish the surface of the lower doped epitaxial layer 240 (if necessary). This planarization process may be accomplished using a CMP planarization process which stops on the separation layer 220. Accordingly, after the CMP planarization process, the top surface of the separation layer 220 is coplanar with the top surface of the lower doped epitaxial layers 240.

Figure 6D:
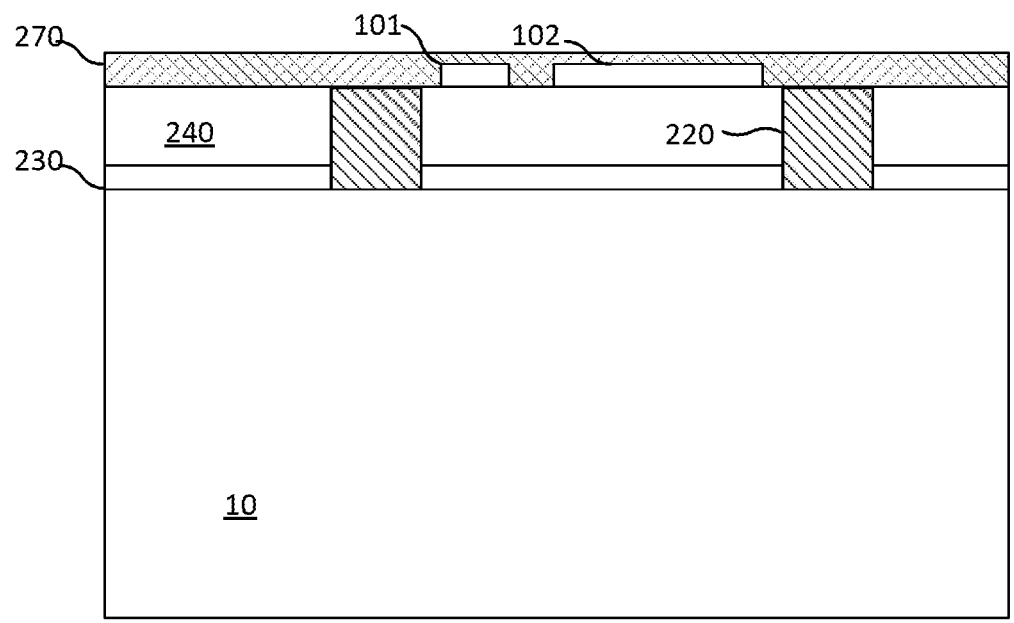

Referring next to FIG. 6D, front end processing may be performed on the exposed lower doped epitaxial layer 240. For example, after forming device regions in and over the lower doped epitaxial layer 240, metallization may be formed over the lower doped epitaxial layer 240 as described in prior embodiments. For example, contacts pads, such as a first contact pad 101 and a second contact 102, for making electrical contact with external circuits may be formed.

A passivation layer 270 is deposited over the metallization layers. In various embodiments, the passivation layer 270 may comprise an oxide, a nitride, a polyimide, or other suitable materials known to one having ordinary skill in the art. The passivation layer 270 may comprise a hard mask in one embodiment, and a resist mask in another embodiment. The passivation layer 270 helps to protect the metallization including the contact pads and the device regions during subsequent processing. In some embodiments, the passivation layer 270 may be skipped.

Figure 6E:
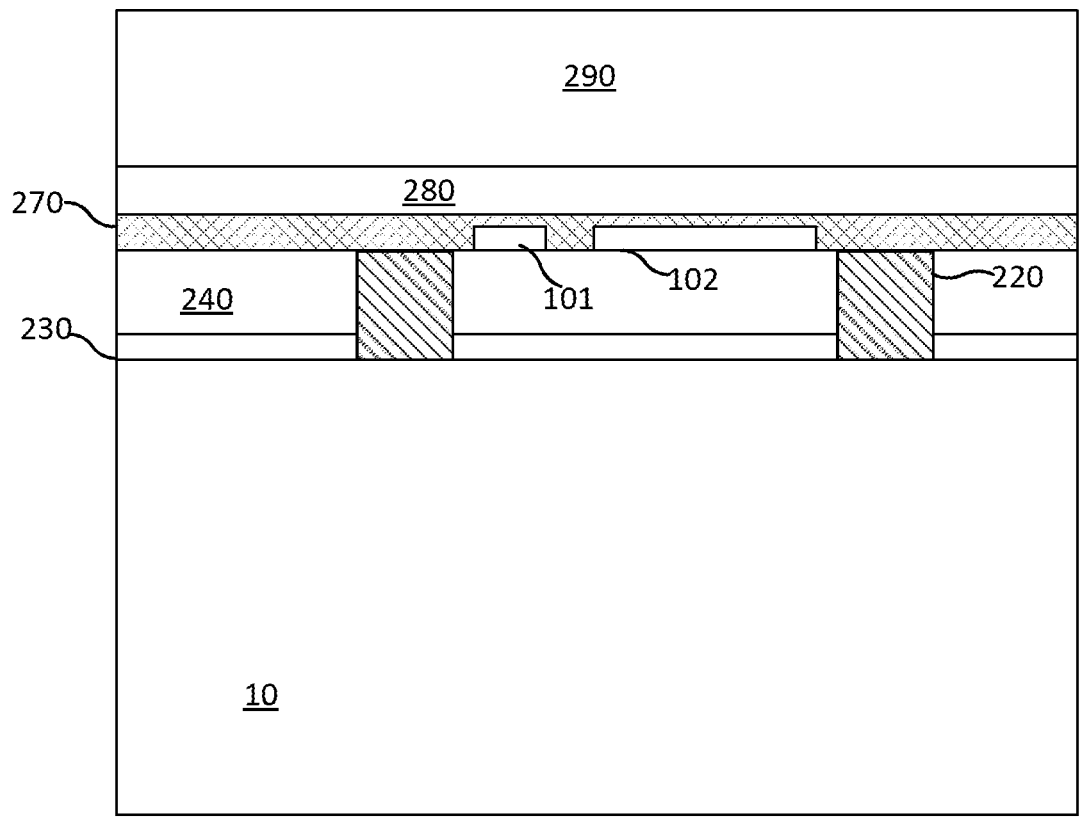

Referring to FIG. 6E, the substrate 10 is attached to a carrier 290. In various embodiments, the carrier 290 may comprise a glass carrier. The carrier 290 may be attached to the front side of the substrate 10 comprising the active devices in various embodiments. In various embodiments, the top surface of the workpiece comprising the substrate 10, the low doped epitaxial layer 240, the passivation layer 270 is coated with an adhesive layer 280. The attachment with the carrier 290 may be formed by a curing process in one or more embodiments.

The adhesive layer 280 may comprise any suitable adhesive material in various embodiments. Further, in some embodiments, a primer coating may be applied prior to coating the adhesive layer 280. The primer coating is tuned to react with the surface of the passivation layer 270 and convert potentially high surface energy surfaces to lower surface energy surfaces by forming a primer layer. Thus, the adhesive layer 280 may interact only with the primer layer improving the bonding.

The adhesive layer 280 may comprise an organic compound such an epoxy based compound in one or more embodiments. In various embodiments, the adhesive layer 280 may comprise an acrylic based, not photoactive, organic glue. In another embodiment, the adhesive layer 280 may comprise SU-8, which is a negative tone epoxy based photo resist.

In alternative embodiments, the adhesive layer 280 may comprise a molding compound. In one embodiment, the adhesive layer 280 may comprise an imide and/or components such a poly-methyl-methacrylate (PMMA) used in forming a poly-imide. In another embodiment, the adhesive layer 280 may comprise components for forming an epoxy-based resin or co-polymer and may include components for a solid-phase epoxy resin and a liquid-phase epoxy resin. Embodiments of the invention also include combinations of different type of adhesive components and non-adhesive components such as combinations of acrylic base organic glue, SU-8, imide, epoxy-based resins etc.

In various embodiments, the adhesive layer 280 may comprise less than about 1% inorganic material, and about 0.1% to about 1% inorganic material in one embodiment. The absence of inorganic content improves the removal of the adhesive layer 280 without leaving residues.

In one or more embodiments, the adhesive layer 280 may comprise thermosetting resins, which may be cured by annealing at an elevated temperature. Alternatively, in some embodiments, a low temperature anneal or bake may be performed to cure the adhesive layer 280 so that adhesive bonding between the carrier 290 and the adhesive layer 280 and between the adhesive layer 280 and the passivation layer 270 is formed. Some embodiments may not require any additional heating and may be cured at room temperature.

Figure 6F:
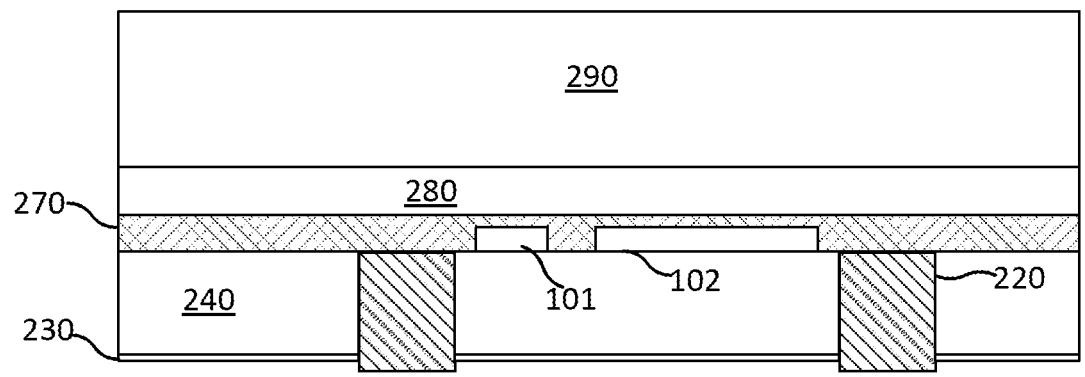

FIG. 6F illustrates the semiconductor structure after thinning the substrate 10 in accordance with an embodiment of the present invention. The substrate 10 may be removed by a thinning process to expose the highly doped epitaxial layer 230 and the structured separation layer 220. In various embodiments, the substrate 10 may be removed using one or more processes such as mechanical grinding, etching, polishing, and others. The structured separation layer 220 may be used as a stopping layer for the thinning process in various embodiments. Further, after exposing the structured separation layer 220, and etching process may be performed to partially etch the highly doped epitaxial layer 230.

Figure 6G:
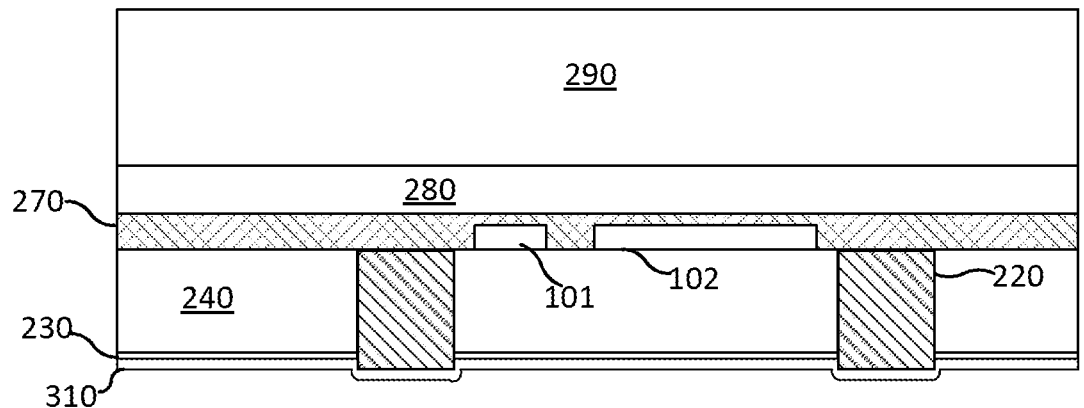

As next illustrated in FIG. 6G, a conductive liner 310 is deposited on the back side of the highly doped epitaxial layer 230 and the structured separation layer 220. In various embodiments, the conductive liner 310 may comprise one or more layers, for example, a barrier layer to prevent diffusion of metal atoms from the underlying back side metal layer and a seed layer for plating the back side metal layer. As an example, the barrier layer may comprise a metal nitride such as titanium nitride, tantalum nitride, tungsten nitride, and others. Similarly, the seed layer may comprise nickel and/or copper in one embodiment. In other embodiments, the conductive liner 310 at the wafer backside may also be structured using a standard lithography and etch process after a deposition process.

Figure 6H:
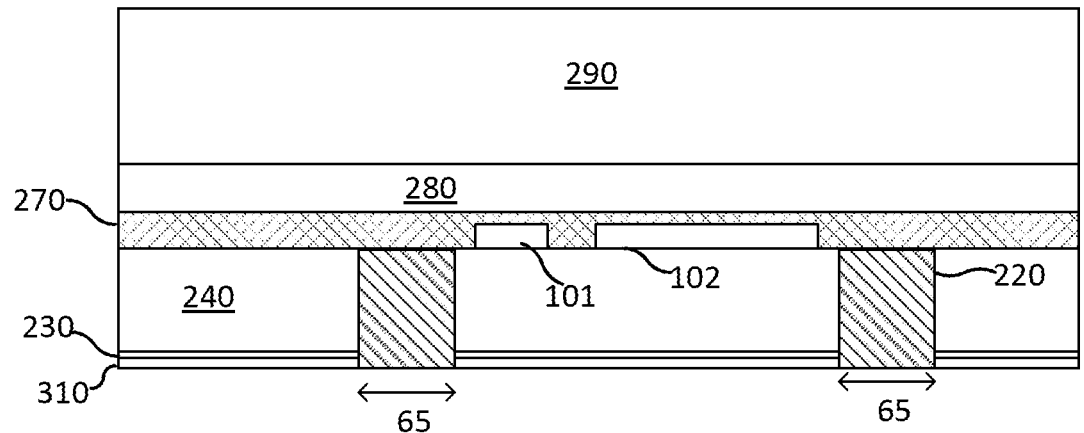

Referring to FIG. 6H, a conductive liner 310 is polished to form a planar surface. Because of the etch-back of the highly doped epitaxial layer 230, which was described with respect to FIG. 6F, the conductive liner 310 covering the structured separation layer 220 is removed. Accordingly, after the planarization process, the structured separation layer 220 separates portions of the conductive liner 310. In other words, the conductive liner 310 is removed under the dicing regions 65 of the substrate 10. In various embodiments, the conductive liner 310 may be formed using a deposition process such as sputtering, physical vapor deposition, chemical vapor deposition, and other processes.

Figure 6I:
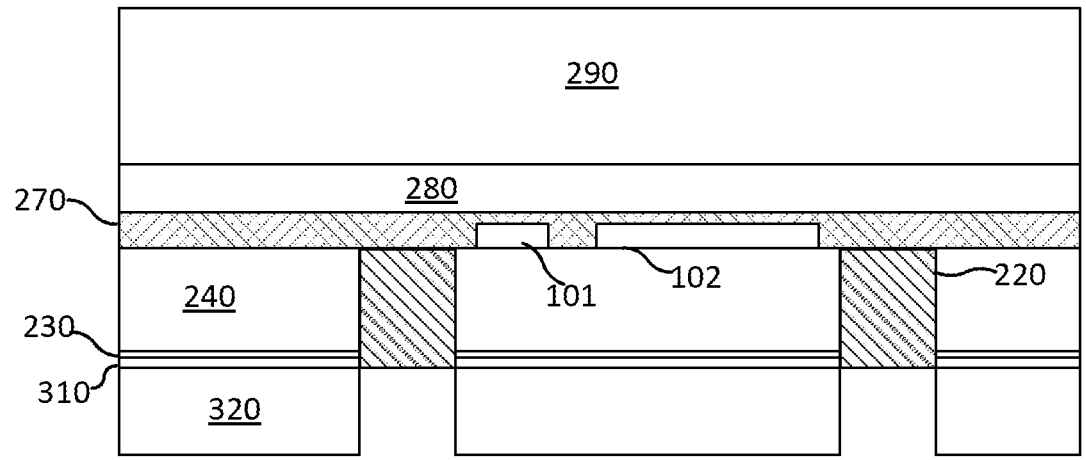

FIG. 6I illustrates the semiconductor structure after the formation of the back side metal layer in accordance with an embodiment of the present invention. In various embodiments, the back side metal layer 320 is formed covering the conductive liner 310. The back side metal layer 320 may be formed using a plating process in one or more embodiments. Accordingly, the structured separation layer 220 is not coated with the back side metal layer 320.

Advantageously, the back side metal layer 320 is formed directly on the epitaxial layers maximizing heat extraction from the active regions of the device. The thin epitaxial layer, such as the lower doped epitaxial layer 240, also contributes to minimizing the ON resistance of the device (e.g., for a vertical transistor device). In this example, the highly doped epitaxial layers 230 may be a drain region of the vertical transistor device.

Figure 6J:
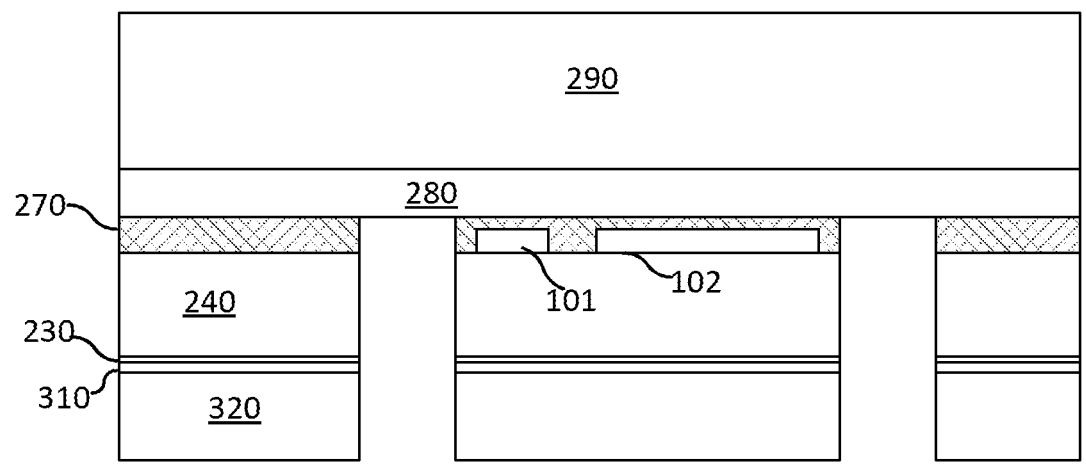

FIG. 6J illustrates the semiconductor structure after removing the structured separation layer 220 in accordance with an embodiment of the present invention. As illustrated FIG. 6J, the structured separation layer 220 may be removed. As an example, the structured separation layer 220 may be removed using a etch process. The etch process may also remove the underlying passivation layer 270 if present. However, the etch process is selected so that the etch does not remove the adhesive layer 280, which would separate the epitaxial layers from the carrier 290.

Figure 6K:
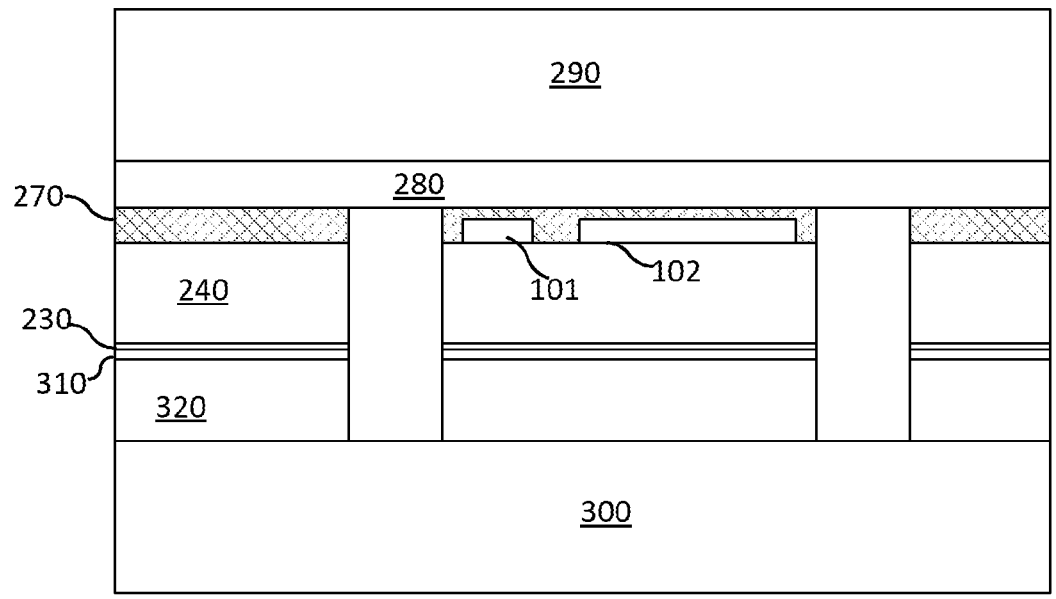
Figure 6L:
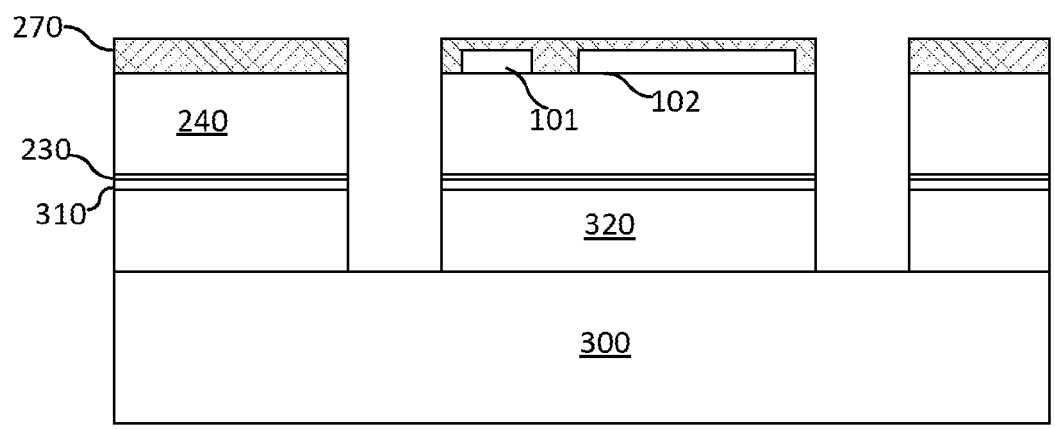

As next illustrated in FIG. 6K, the back side metal layer 320 may be attached to a tape and/or foil 300. After attaching the semiconductor structure to the foil 300, the adhesive layer 280 and the carrier 290 are separated as illustrated in FIG. 6L. Unlike prior embodiments, no additional dicing process is required after the removal of the structured separation layer 220, which held together the various regions of the highly doped epitaxial layer 230 and the low doped epitaxial layer 240. Further, the back side metal layer 320 is not formed directly under the structured separation layer 220 avoiding the difficulty of dicing through a thick metal layer.

Figure 6M:
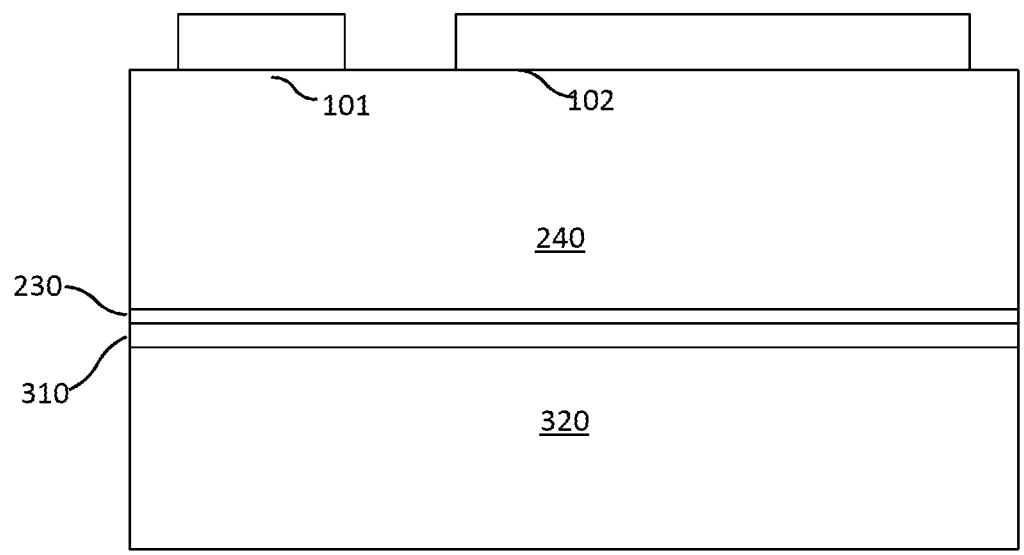

Subsequent processing can continue as in conventional semiconductor processing. The semiconductor chip thus fabricated is illustrated in FIG. 6M. Unlike prior embodiments, the final device does not have any part of the substrate 10.

As described in various embodiments, a material that comprises a metal may, for example, be a pure metal, a metal alloy, a metal compound, an intermetallic and others, i.e., any material that includes metal atoms. For example, copper may be a pure copper or any material including copper such as, but not limited to, a copper alloy, a copper compound, a copper intermetallic, an insulator comprising copper, and a semiconductor comprising copper.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. As an illustration, the embodiments described in FIGS. 1-6 may be combined with each other in alternative embodiments. It is therefore intended that the appended claims encompass any such modifications or embodiments.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include

What is claimed is:

1. A method of forming a semiconductor chip, the method comprising:
   providing a substrate comprising a first region, a second region, and a third region, the first region disposed between the second region and the third region;
   forming a masking structure covering the first region of the substrate, the forming of the masking structure comprising oxidizing the surface of the first region;
   growing an epitaxial layer from a first major surface of the substrate, the epitaxial layer comprising a first layer disposed over the second region and a second layer disposed over the third region, the masking structure preventing the epitaxial layer from growing at the first region; and
   using a singulation process dicing through the masking structure and the first region of the substrate, wherein the singulation process forms a first semiconductor chip comprising the first layer and a second semiconductor chip comprising the second layer without dicing through the epitaxial layer.

2. The method of claim 1, wherein the substrate and the epitaxial layer are a same semiconductor material.

3. The method of claim 1, wherein the substrate and the epitaxial layer comprise a different semiconductor material.

4. The method of claim 1, wherein the epitaxial layer comprises a drift region.

5. The method of claim 1, further comprising forming a device region in the epitaxial layer.

6. The method of claim 1, wherein singulating comprises dicing the substrate through the first region.

7. The method of claim 1, wherein the epitaxial layer comprises gallium nitride.

8. The method of claim 1, wherein the epitaxial layer comprises silicon carbide or silicon.

9. The method of claim 1, wherein growing an epitaxial layer comprises forming a trench between the first layer and the second layer, wherein the masking structure forms a bottom surface of the trench.

10. The method of claim 9, further comprising:
    filling the trench with a dummy fill material;
    forming a device region in the epitaxial layer; and
    forming the semiconductor chip by dicing through the substrate and the dummy fill material.

11. The method of claim 1, wherein forming a masking structure further comprises:
    forming a hardmask over the substrate, the hardmask covering the second region and the third region.

12. The method of claim 1, wherein using the singulation process to form the semiconductor chip comprises removing the substrate.

13. The method of claim 1, wherein growing an epitaxial layer comprises growing a highly doped epitaxial region followed by a lower doped epitaxial region.

14. The method of claim 1, wherein the first layer is attached to the second layer through the masking structure.

15. The method of claim 14, wherein using the singulation process to form the semiconductor chip comprises etching the masking structure.

16. The method of claim 14, further comprising:
    forming a first contact pad over the first major surface of the substrate;
    attaching a carrier over the first major surface of the substrate;
    thinning the substrate to expose the epitaxial layer and the masking structure; and
    forming a back side metal over the exposed epitaxial layer.

17. The method of claim 16, further comprising:
    etching the exposed epitaxial layer after the thinning;
    forming a seed layer over the epitaxial layer and the masking structure; and
    removing the seed layer from over the masking structure, wherein the back side metal is formed over the seed layer after removing the seed layer from over the masking structure.

18. The method of claim 1, wherein, during the growing of the epitaxial layer, the masking structure prevents the epitaxial layer in the second region to merge with the epitaxial layer in the third region.

19. A method of forming a semiconductor chip, the method comprising:
    forming a selective epitaxial layer comprising device regions;
    forming a masking structure around sidewalls of the epitaxial layer, the masking structure being part of an exposed surface of the semiconductor chip, wherein the epitaxial layer is attached to an adjacent epitaxial layer through the masking structure; and
    forming the semiconductor chip by a singulation process, wherein the singulation process dices through the masking structure without dicing through the selective epitaxial layer.

20. The method of claim 19, wherein forming the masking structure comprises forming a local oxidation of silicon (LOCOS) region.

21. The method of claim 19, wherein forming the selective epitaxial layer comprises forming a layer comprising gallium and nitrogen.

22. The method of claim 19, further comprising forming a fill material over the masking structure.

23. The method of claim 22, wherein the fill material is part of the exposed surface of the semiconductor chip.

24. The method of claim 19, further comprising a substrate, wherein the selective epitaxial layer is formed over the substrate.

25. The method of claim 24, wherein the substrate and the selective epitaxial layer are a same semiconductor material.

26. The method of claim 24, wherein the substrate and the selective epitaxial layer comprise a different semiconductor material.

27. The method of claim 24, wherein the selective epitaxial layer comprises a drift region.

28. The method of claim 19, further comprising:
    forming a further selective epitaxial layer, wherein the selective epitaxial layer is formed over the further selective epitaxial layer, wherein the selective epitaxial layer and the further selective epitaxial layer comprise a different semiconductor material.

29. The method of claim 28, wherein a band gap of the selective epitaxial layer is greater than the further selective epitaxial layer.

30. The method of claim 19, wherein the device regions comprise a source region and a channel region of a transistor.

31. The method of claim 19, wherein forming the masking structure comprises damaging a portion of the substrate.

32. The method of claim 31, wherein damaging comprises using a plasma process, ion implant process, an irradiation process.

33. A method of forming a semiconductor chip, the method comprising:

forming a selective epitaxial layer comprising device regions over a substrate;

forming a masking structure in the substrate;

forming a fill material over the masking structure, wherein the fill material is formed around sidewalls of the selective epitaxial layer and part of an exposed surface of the semiconductor chip, wherein the fill material and the selective epitaxial layer comprise different materials; and forming the semiconductor chip by a singulation process, wherein the singulation process dices through the fill material, the masking structure, and the substrate without dicing through the selective epitaxial layer.

34. The method of claim 33, wherein the substrate and the selective epitaxial layer are a same semiconductor material.

35. The method of claim 33, wherein the substrate and the selective epitaxial layer comprise a different semiconductor material.

36. The method of claim 33, wherein a thickness of the epitaxial layer is larger than the thickness of the masking structure.

37. The method of claim 33, wherein a thickness of the epitaxial layer measured from a top surface of the masking structure is less than a width of the masking structure.

38. The method of claim 33, wherein the masking structure comprises a damage region.

39. The method of claim 33, wherein the masking structure is part of the exposed surface of the method.

40. The method of claim 33, wherein the selective epitaxial layer comprises a layer comprising gallium and nitrogen.

41. The method of claim 33, wherein the device regions comprise a source region and a channel region of a transistor.

* * * * *